(12) United States Patent
Ahn et al.

(10) Patent No.: US 12,557,641 B2
(45) Date of Patent: Feb. 17, 2026

(54) SEMICONDUCTOR DEVICE AND METHOD FOR MANUFACTURING THE SAME

(71) Applicant: Samsung Electronics Co., Ltd., Suwon-si (KR)

(72) Inventors: Sang Hoon Ahn, Seongnam-si (KR); Kyung Seok Oh, Seoul (KR); Seung-Heon Lee, Seoul (KR); Jun Hyuk Lim, Suwon-si (KR)

(73) Assignee: Samsung Electronics Co., Ltd.

( * ) Notice: Subject to any disclaimer, the term of this patent is extended or adjusted under 35 U.S.C. 154(b) by 556 days.

(21) Appl. No.: 18/061,642

(22) Filed: Dec. 5, 2022

(65) Prior Publication Data

US 2023/0268276 A1 Aug. 24, 2023

(30) Foreign Application Priority Data

Feb. 21, 2022 (KR) .................. 10-2022-0021902

(51) Int. Cl.
*H01L 23/532* (2006.01)
*H01L 21/768* (2006.01)
*H01L 23/522* (2006.01)

(52) U.S. Cl.
CPC .... *H01L 23/53295* (2013.01); *H01L 21/7682* (2013.01); *H01L 21/76826* (2013.01);
(Continued)

(58) Field of Classification Search
CPC ........... H01L 23/53295; H01L 21/7682; H01L 21/76826; H01L 21/76877; H01L 23/5226;
(Continued)

(56) References Cited

U.S. PATENT DOCUMENTS 7,217,648 B2 5/2007 Lu et al.
7,588,995 B2 9/2009 Yu et al.
(Continued)

FOREIGN PATENT DOCUMENTS

KR 10-2020-0011069 A 2/2020
KR 10-2021-0148834 A 12/2021

OTHER PUBLICATIONS

European Search Report dated Jul. 10, 2023 issued in European Patent Application No. 23154306.7-1211.
(Continued)

*Primary Examiner* — Karen Kusumakar
(74) *Attorney, Agent, or Firm* — Fish & Richardson P.C.

(57) ABSTRACT

There is provided a semiconductor device capable of improving the performance and reliability of a device. The semiconductor device may include a first interlayer insulating film containing therein a plurality of pores, a first line structure in the first interlayer insulating film, an inserted insulating film extending along and on a upper surface of the first interlayer insulating film and in contact with the first interlayer insulating film, a barrier insulating film in contact with the inserted insulating film and extending along an upper surface of the inserted insulating film and an upper surface of the first line structure, a second interlayer insulating film on the barrier insulating film and a second line structure disposed in the second interlayer insulating film and connected to the first line structure.

19 Claims, 26 Drawing Sheets

(52) U.S. Cl.
CPC .... *H01L 21/76877* (2013.01); *H01L 23/5226* (2013.01); *H01L 23/53223* (2013.01); *H01L 2221/1047* (2013.01)

(58) Field of Classification Search
CPC ....... H01L 23/53223; H01L 2221/1047; H01L 21/76834; H01L 23/481; H01L 21/76895; H01L 23/485; H01L 21/76835; H01L 21/76843; H01L 21/7685; H01L 23/5283
See application file for complete search history.

(56) References Cited

U.S. PATENT DOCUMENTS

| | | | |
|---|---|---|---|
| 8,927,430 B2 | 1/2015 | Bruce et al. | |
| 8,932,934 B2 | 1/2015 | Chae et al. | |
| 9,053,948 B2 | 6/2015 | Kim et al. | |
| 9,054,052 B2 | 6/2015 | Licausi et al. | |
| 10,840,084 B2 | 11/2020 | Yamaguchi | |
| 11,450,609 B2 * | 9/2022 | Ho | H01L 21/76871 |
| 2006/0006543 A1 | 1/2006 | Shimazu et al. | |
| 2006/0128166 A1 | 6/2006 | Nakata et al. | |
| 2020/0035613 A1 * | 1/2020 | Kim | H01L 21/76877 |
| 2021/0233809 A1 | 7/2021 | Lee et al. | |
| 2021/0398898 A1 * | 12/2021 | Yang | H01L 21/76885 |

OTHER PUBLICATIONS

European Office Action dated Jul. 21, 2023 issued in European Patent Application No. 23 154 306.7-1211.
Office Action in Korean Appln. No. 10-2022-0021902, mailed on Sep. 15, 2025, 18 pages (with English translation).

* cited by examiner

SEMICONDUCTOR DEVICE AND METHOD FOR MANUFACTURING THE SAME

CROSS-REFERENCE TO RELATED APPLICATION

This application claims priority from Korean Patent Application No. 10-2022-0021902 filed on Feb. 21, 2022 in the Korean Intellectual Property Office, and all the benefits accruing therefrom under 35 U.S.C. 119, the contents of which in its entirety are herein incorporated by reference.

BACKGROUND

Field

The present disclosure relates to methods for manufacturing a semiconductor device, and more specifically, to semiconductor devices using a low dielectric constant material including pores as a material of an interlayer insulating film and/or methods for manufacturing the same.

Description of Related Art

In a semiconductor device manufacturing process, a dielectric constant k of an interlayer insulating film continues to decrease as scaling of the semiconductor device continues. Minimizing integration damage to the interlayer insulating film made of the low dielectric constant (low-k) material is an important factor for continuously reducing a feature size.

Therefore, as the feature size decreases, improvement of resistive capacitance and reliability of the interlayer insulating film may be important.

SUMMARY

Some example embodiments of the present disclosure provide semiconductor devices capable of improving element performance and reliability.

Some example embodiments of the present disclosure provide methods for manufacturing a semiconductor device capable of improving element performance and reliability.

Advantages and effects according to the present disclosure are not limited to the above-mentioned advantages and effects. Other advantages and effects according to the present disclosure that are not mentioned may be understood based on following descriptions, and may be more clearly understood based on some example embodiments according to the present disclosure. Further, it will be easily understood that the purposes and advantages according to the present disclosure may be realized using means shown in the claims and combinations thereof.

According to an aspect of the present disclosure, a semiconductor device includes a first interlayer insulating film containing therein a plurality of pores, a first line structure in the first interlayer insulating film, an inserted insulating film extending along and on a upper surface of the first interlayer insulating film and in contact with the first interlayer insulating film, a barrier insulating film in contact with the inserted insulating film and extending along an upper surface of the inserted insulating film and an upper surface of the first line structure, a second interlayer insulating film on the barrier insulating film and a second line structure disposed in the second interlayer insulating film and connected to the first line structure.

According to another aspect of the present disclosure, a semiconductor device includes a first interlayer insulating film containing therein a plurality of pores, a first line structure in the first interlayer insulating film, the first line structure including a wire line and a via connected to the wire line, an inserted insulating film on the first interlayer insulating film and including a silicon oxide-based material, a barrier insulating film disposed on the inserted insulating film and including a silicon nitride-based material, the barrier insulating film covering an upper surface of the wire line, a second interlayer insulating film on the barrier insulating film, and a second line structure in the second interlayer insulating film and connected to the first line structure, wherein the first interlayer insulating film includes, a first damaged area extending along an upper surface of the first interlayer insulating film and a second damaged area extending along a sidewall of the wire line, and wherein a thickness of the second damaged area is greater than a thickness of the first damaged area.

According to still another aspect of the present disclosure, a semiconductor device includes a first interlayer insulating film, a first line structure in the first interlayer insulating film, a second interlayer insulating film on the first interlayer insulating film and the first line structure, the second interlayer insulating film including a plurality of pores therein, a second line structure in the second interlayer insulating film, the second line structure including a barrier conductive film and a filling conductive film on the barrier conductive film, an inserted insulating film extending along a upper surface of the second interlayer insulating film and not extending along an upper surface of the filling conductive film, a barrier insulating film in contact with the inserted insulating film and extending along a upper surface of the inserted insulating film and an upper surface of the second line structure, a third interlayer insulating film on the barrier insulating film and a third line structure in the third interlayer insulating film, wherein each of the first interlayer insulating film and the third interlayer insulating film is free of a pore.

According to still another aspect of the present disclosure, there is provided a method for manufacturing a semiconductor device semiconductor device the method comprising, forming a pre-interlayer insulating film containing therein a plurality of pores, filling the plurality of pores with a pore filler to form a modified interlayer insulating film, forming a first line structure in the modified interlayer insulating film, forming an inserted insulating film along an upper surface of the modified interlayer insulating film, after the inserted insulating film has been formed, removing the pore filler in the modified interlayer insulating film to transform the modified interlayer insulating film to a first interlayer insulating film, after the first interlayer insulating film has been formed, forming a barrier insulating film along an upper surface of the inserted insulating film and a upper surface of the first line structure and forming a second line structure on the barrier insulating film.

BRIEF DESCRIPTION OF DRAWINGS

The above and other aspects and features of the present disclosure will become more apparent by describing in detail some example embodiments thereof with reference to the attached drawings, in which.

DETAILED DESCRIPTION

Figure 1:
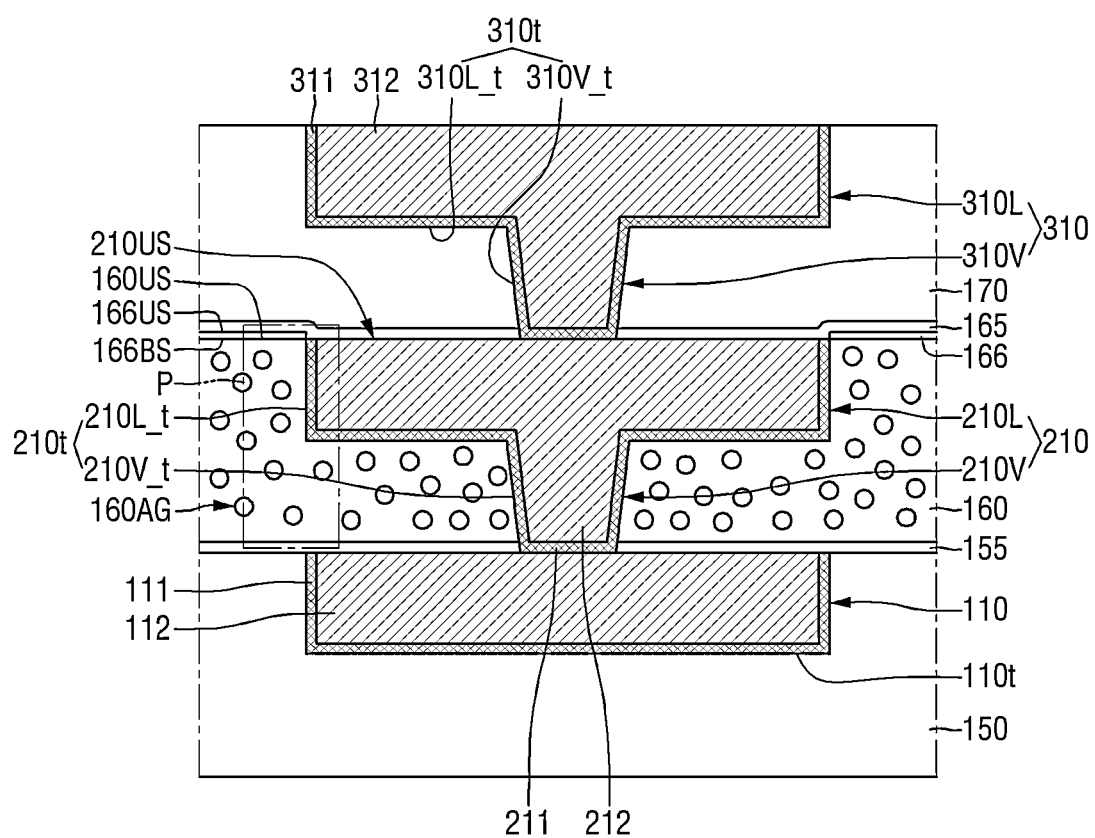
FIG. 1 is a diagram for illustrating a semiconductor device according to an example embodiment.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various example embodiments are illustrated and described further below. It will be understood that the description herein is not intended to limit the claims to the specific example embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating some example embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular example embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain example embodiment is implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various example embodiments of the present disclosure may be partially or entirely combined with each other, and may be technically associated with each other or operate with each other. The example embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction D1", "second direction D2" and "third direction D3" should not be interpreted only to have a geometric relationship in which the first direction, the second direction, and the third direction are perpendicular to each other. The "first direction D1", "second direction D2" and "third direction D3" may be interpreted to have more broadly within a range in which components herein may work functionally.

Hereinafter, some example embodiments of the present disclosure will be described with reference to the drawings.

In the drawings of a semiconductor device according to some example embodiments, a fin-type transistor (FinFET) including a channel area of a fin-type pattern shape, a transistor including a nanowire or a nanosheet, a MBCFET™ (a Multi-Bridge Channel Field Effect Transistor) or a vertical transistor (a vertical FET) is shown by way of example. The present disclosure is not limited thereto. According to some example embodiments, the semiconductor device may include a tunneling transistor (a tunneling FET,) or a 3D transistor. according to some example embodiments, the semiconductor device may include a planar transistor. In addition, the technical idea of the present disclosure may be applied to transistors (2D material based FETs) based on a 2D material and a heterostructure thereof.

Further, the semiconductor device according to some example embodiments may include a bipolar junction transistor, a lateral double diffusion transistor (LDMOS), and the like.

Figure 2:
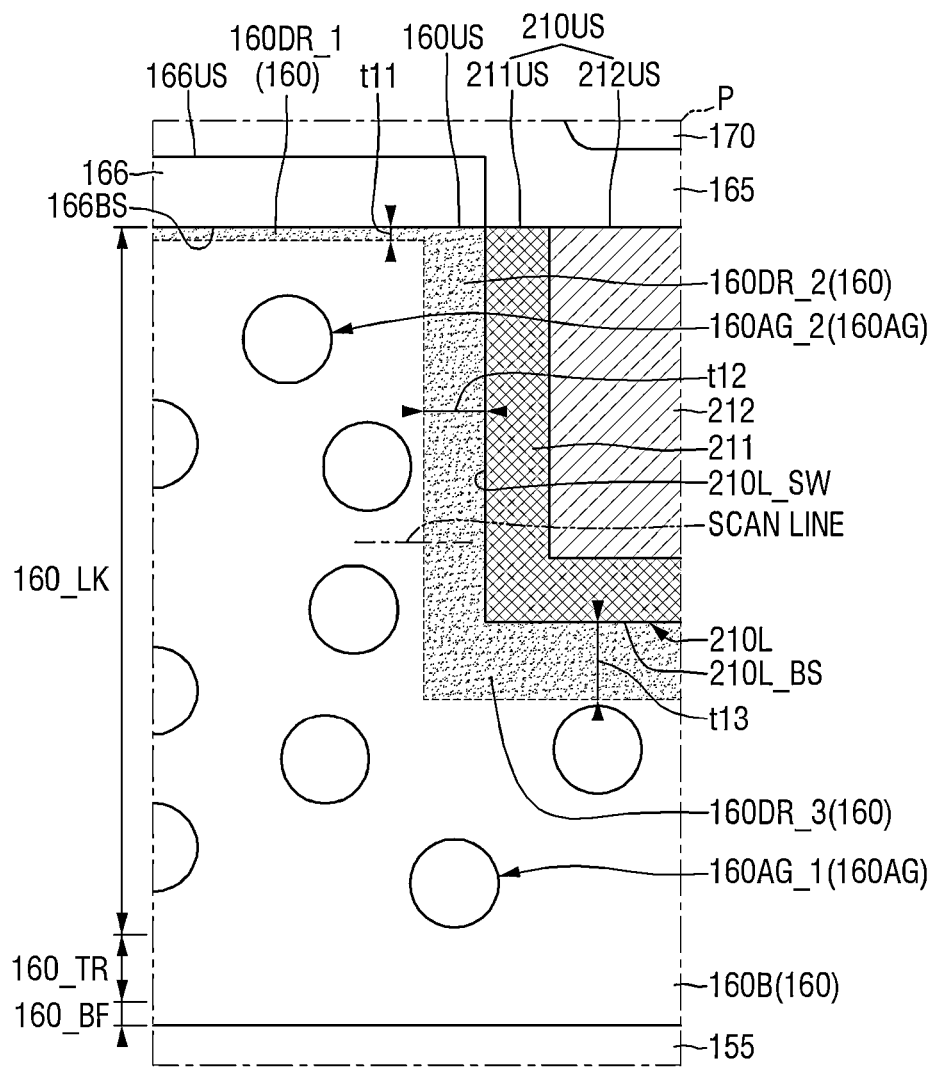
FIG. 2 is an enlarged view of a 'P' portion of FIG. 1.
Figure 3:
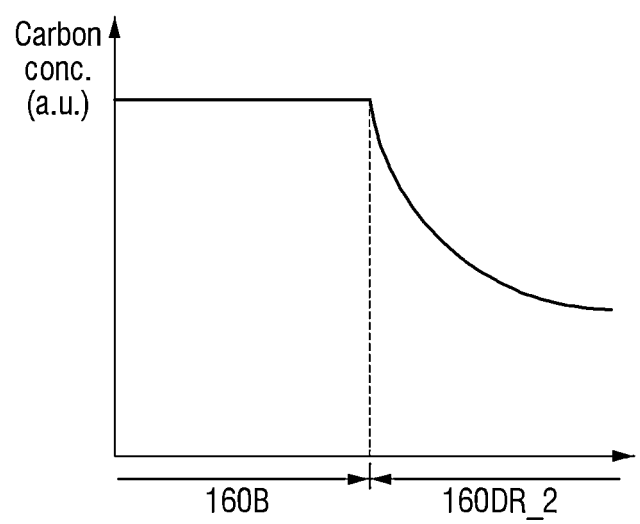
FIG. 3 is a graph schematically showing a carbon concentration along a SCAN LINE of FIG. 2.
Figure 4:
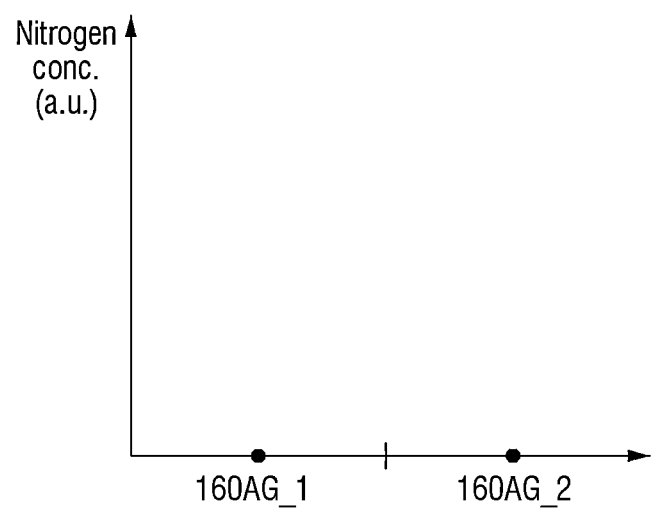
FIG. 4 to FIG. 6 are graphs indicating a nitrogen concentration in each of a first pore and a second pore of FIG. 2.
Figure 5:
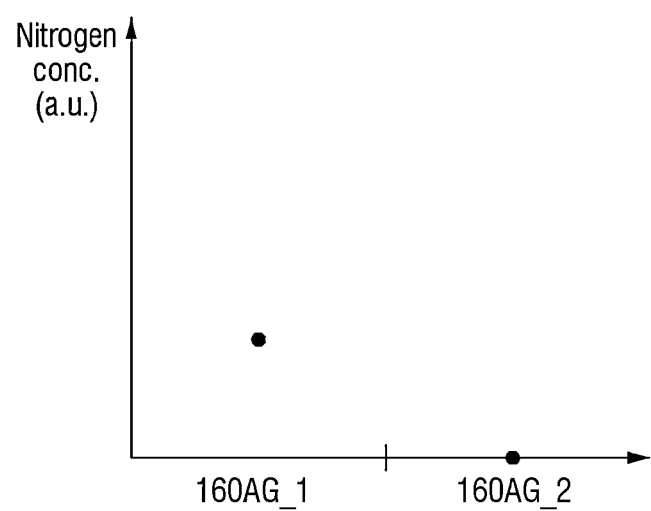
Figure 6:
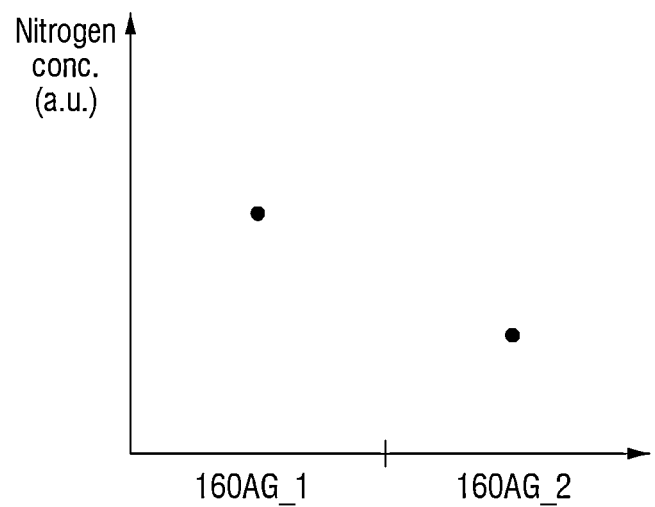

FIG. 1 is a diagram for illustrating a semiconductor device according to an example embodiment. FIG. 2 is an enlarged view of a 'P' portion of FIG. 1. FIG. 3 is a graph schematically showing a carbon concentration along a SCAN LINE of FIG. 2. FIG. 4 to FIG. 6 are graphs indicating a nitrogen concentration in each of a first pore and a second pore of FIG. 2.

Referring to FIG. 1 to FIG. 6, the semiconductor device according to an example embodiment may include a first line structure 110, a second line structure 210, a third line structure 310, and an inserted insulating film 166.

The first line structure 110 may be disposed in a first interlayer insulating film 150. The first line structure 110 may extend in an elongated manner in one direction.

The first line structure 110 may have a line shape extending in one direction. In this regard, "one direction" may be a length direction rather than a width direction of the first line structure 110.

The first interlayer insulating film 150 may cover a gate electrode and a source/drain of a transistor formed in a FEOL (Front-end-of-Line) process. In some example embodiments, the first interlayer insulating film 150 may be an interlayer insulating film formed in a BEOL (Back-end-of-line) process.

In other words, in one example, the first line structure 110 may be a contact or a contact line formed in a MOL (Middle-of-Line) process. In another example, the first line structure 110 may be a connection line formed in a BEOL (Back-end-of-line) process. In a following description, an example in which the first line structure 110 is the connection line formed in the BEOL process is described.

The first interlayer insulating film 150 may include, for example, at least one of silicon oxide, silicon nitride, and silicon oxynitride.

The first line structure 110 may be disposed at a first metal level. The first interlayer insulating film 150 may include a first line trench 110t extending in an elongated manner in one direction.

The first line structure 110 may be disposed in the first line trench 110t. The first line structure 110 fills the first line trench 110t.

The first line structure 110 may include a first barrier conductive film 111 and a first filling conductive film 112. The first filling conductive film 112 is disposed on the first barrier conductive film 111.

The first barrier conductive film 111 may extend along and on a sidewall and a bottom surface of the first line trench 110t. The first filling conductive film 112 may fill the remainder of the first line trench 110t. Although the first barrier conductive film 111 is shown as a single film, this is only for convenience of illustration. The disclosure is not limited thereto.

Unlike what is shown, the first line structure 110 may include a capping conductive film extending along an upper surface of the first filling conductive film 112. For example, the capping conductive film may include, but is not limited to, at least one of cobalt (Co), ruthenium (Ru), and manganese (Mn).

Unlike what is shown, the first line structure 110 may have a single film structure. Although not shown, the first line structure 110 may further include a via pattern connected to a conductive pattern disposed under the first line structure 110.

The first line structure 110 may be formed using, for example, a damascene method. In FIG. 1, a width in a length direction of the first line structure 110 is shown to be constant. However, the present disclosure is not limited thereto. Unlike what is illustrated, the width in the length direction of the first line structure 110 may decrease as the structure 110 extends away from a upper surface of the first interlayer insulating film 150.

A first barrier insulating film 155 may be disposed on the first line structure 110 and the first interlayer insulating film 150. A second interlayer insulating film 160 may be disposed on the first barrier insulating film 155. The second interlayer insulating film 160 may contact the first barrier insulating film 155. The first barrier insulating film 155 may be disposed between the first interlayer insulating film 150 and the second interlayer insulating film 160.

The first barrier insulating film 155 extends along and on at least a portion of a upper surface of the first filling conductive film 112. The first barrier insulating film 155 covers at least a portion of a upper surface of the first filling conductive film 112.

The first barrier insulating film 155 may serve as an etch stopper film. A description of a structure of the second interlayer insulating film 160 will be provide later.

The first barrier insulating film 155 may include, for example, at least one of silicon nitride (SiN), silicon oxynitride (SiON), silicon oxycarbonitride (SiOCN), silicon boron nitride (SiBN), silicon oxyboronitride (SiOBN), silicon oxycarbide (SiOC), aluminum oxide (AlO), aluminum nitride (AlN), aluminum oxycarbide (AlOC), and combinations thereof.

Although the first barrier insulating film 155 is shown as a single film, this is only for convenience of illustration. The disclosure is not limited thereto.

The second interlayer insulating film 160 may include a second line trench 210t. The second line trench 210t may extend through the first barrier insulating film 155.

The second line trench 210t may expose a portion of the first line structure 110. The second line trench 210t may include a second via trench 210V_t and a second wire line trench 210L_t. The second wire line trench 210L_t may extend in an elongated manner in one direction. The second wire line trench 210L_t may extend to a upper surface 160US of the second interlayer insulating film. The second via trench 210V_t may be formed on a bottom surface of the second wire line trench 210L_t.

For example, the bottom surface of the second line trench 210t may be a bottom surface of the second via trench 210V_t. The bottom surface of the second line trench 210t may be defined by the first line structure 110. For example, the bottom surface of the second via trench 210V_t may be defined by the first line structure 110.

A sidewall of the second line trench 210t may include a sidewall and a bottom surface of the second line trench 210L_t and a sidewall of the second via trench 210V_t. The sidewall and the bottom surface of the second wire line trench 210L_t may be defined by the second interlayer insulating film 160. A sidewall of the second via trench 210V_t may be defined by the second interlayer insulating film 160 and the first barrier insulating film 155.

In one example, when a capping conductive film extending along a upper surface of each of the first line structure 110 and the first filling conductive film 112 is further included, the second line trench 210t may extend through the capping conductive film. In another example, when a capping conductive film extending along a upper surface of each of the first line structure 110 and the first filling conductive film 112 is further included, the second line trench 210t may not extend through the capping conductive film.

A second line structure 210 may be disposed in the second line trench 210t. The second line structure 210 may fill the second line trench 210t. The second line structure 210 may be disposed in the second interlayer insulating film 160.

The second line structure 210 is disposed on the first line structure 110. The second line structure 210 may be connected to the first line structure 110.

The second line structure 210 includes a second wire line 210L and a second via 210V. The second via 210V is connected to the second wire line 210L. The second via 210V may connect the second wire line 210L and the first line structure 110 to each other.

The second line structure 210 fills the second via trench 210V_t and the second wire line trench 210L_t. The second wire line 210L is disposed in the second wire line trench 210L_t. The second via 210V is disposed in the second via trench 210V_t.

The second wire line 210L is disposed at a second metal level different from the first metal level. The second wire line 210L is disposed at the second metal level higher than the first metal level.

The second line structure 210 may include a second barrier conductive film 211 and a second filling conductive film 212. The second barrier conductive film 211 may be disposed between the second interlayer insulating film 160 and the second filling conductive film 212.

In the semiconductor device according to some example embodiments, the second line structure 210 may not include a capping conductive film. A upper surface 210US of the second line structure may be defined by the second barrier conductive film 211 and the second filling conductive film 212. The upper surface 210US of the second line structure may include a upper surface 211US of the second barrier conductive film and a upper surface 212US of the second filling conductive film.

The second barrier conductive film 211 may extend along and on a sidewall and a bottom surface of the second line trench 210t. The second barrier conductive film 211 may extend along and on a sidewall and a bottom surface of the second wire line trench 210L_t and a sidewall and a bottom surface of the second via trench 210V_t.

The second filling conductive film 212 is disposed on the second barrier conductive film 211. The second filling conductive film 212 may fill the rest of the second line trench 210t.

The upper surface 211US of the second barrier conductive film is shown to be coplanar with the upper surface 212US of the second filling conductive film. However, the present disclosure is not limited thereto. Unlike what is shown, a vertical level of the upper surface 211US of the second barrier conductive film may be lower or higher than that of the upper surface 212US of the second filling conductive film.

Although the upper surface 210US of the second line structure is shown to be coplanar with a upper surface 160US of the second interlayer insulating film, the present disclosure is not limited thereto.

A width in a length direction of the second wire line 210L is illustrated as being constant. However, the present disclosure is not limited thereto. Unlike what is illustrated, the width in the length direction of the second wire line 210L may decrease as the line 210L extends away from the upper surface 160US of the second interlayer insulating film.

The inserted insulating film 166 is disposed on the second interlayer insulating film 160. The inserted insulating film 166 extends along and on the upper surface 160US of the second interlayer insulating film. The inserted insulating film 166 may contact the second interlayer insulating film 160.

The inserted insulating film 166 does not extend along and on at least a portion of a upper surface 210US of the second line structure. For example, the inserted insulating film 166 does not extend along and on the upper surface 210US of the second line structure.

In other words, the inserted insulating film 166 does not extend along and on the upper surface 211US of the second barrier conductive film and the upper surface 212US of the second filling conductive film. The inserted insulating film 166 does not cover the upper surface 211US of the second barrier conductive film and the upper surface 212US of the second filling conductive film.

The inserted insulating film 166 may include a upper surface 166US and a bottom surface 166BS. The bottom surface 166BS of the inserted insulating film may face the second interlayer insulating film 160. The bottom surface 166BS of the inserted insulating film may contact the upper surface 160US of the second interlayer insulating film. The upper surface 166US of the inserted insulating film may be an opposite surface to the bottom surface 166BS of the inserted insulating film.

The inserted insulating film 166 may be a permeable insulating film through which carbon, nitrogen and moisture ($H_2O$), etc. may pass. The inserted insulating film 166 may have a thickness sized such that the film 166 may maintain the permeability thereof. The thickness of the inserted insulating film 166 may be, for example, smaller than or equal to 20 Å. However, the present disclosure is not limited thereto. In another example, the thickness of the inserted insulating film 166 may vary depending on a type of a material passing through the inserted insulating film 166 and a condition for forming the inserted insulating film 166.

The inserted insulating film 166 includes an insulating material. The inserted insulating film 166 may include a silicon oxide-based material. The inserted insulating film 166 may include, for example, at least one of silicon oxide, silicon oxycarbide, and silicon oxycarbonitride.

In this regard, "silicon oxide-based material" may mean a material in which an oxygen percentage except for a silicon percentage is the largest. For example, silicon oxycarbonitride as the silicon oxide-based material may contain silicon, oxygen, carbon, and nitrogen. In this regard, the percentage (for example, an atomic percentage) of oxygen contained in silicon oxycarbonitride is greater than each of a percentage of carbon contained in silicon oxycarbonitride and a percentage of nitrogen contained in silicon oxycarbonitride. In other words, silicon oxycarbonitride as the silicon oxide-based material may be a material in which carbon and nitrogen are doped into a matrix made of silicon oxide.

In one example, the inserted insulating film 166 may contain a metal. The inserted insulating film 166 may contain, for example, aluminum (Al). However, the present disclosure is not limited thereto. The inserted insulating film 166 may be formed at a temperature at which an insulating film is not formed well due to temperature constraint of a manufacturing process. That is, in order to form the inserted insulating film 166 on the second interlayer insulating film 160, metal catalyst may be used. The metal contained in the inserted insulating film 166 may act as the metal catalyst during the manufacturing process.

In another example, the inserted insulating film 166 may not contain the metal.

The inserted insulating film 166 may serve as a protective film that mitigates or prevents the second interlayer insulating film 160 from being damaged during the manufacturing process. Further, the inserted insulating film 166 may serve as a gas permeable film to allow gas to pass therethrough.

A second barrier insulating film 165 is disposed on the inserted insulating film 166 and the second line structure 210. The second barrier insulating film 165 is disposed on the second interlayer insulating film 160. The inserted insulating film 166 is disposed between the second barrier insulating film 165 and the second interlayer insulating film 160. The inserted insulating film 166 may contact the second barrier insulating film 165.

The second barrier insulating film 165 extends along and on the upper surface 166US of the inserted insulating film and the upper surface 210US of the second line structure. The second barrier insulating film 165 may cover the upper surface 166US of the inserted insulating film and the upper surface 210US of the second line structure.

For example, the second barrier insulating film 165 may contact the upper surface 210US of the second line structure. The second barrier insulating film 165 may contact the upper surface 211US of the second barrier conductive film and the upper surface 212US of the second filling conductive film. The second barrier insulating film 165 covers the upper surface 211US of the second barrier conductive film and the upper surface 212US of the second filling conductive film.

The second barrier insulating film 165 may include a silicon nitride-based material. The second barrier insulating film 165 may include, for example, at least one of silicon carbonitride and silicon nitride. However, the present disclosure is not limited thereto. In the semiconductor device according to some example embodiments, the second barrier insulating film 165 may include silicon carbonitride.

In this regard, "silicon nitride-based material" may mean a material in which a nitrogen percentage except for a silicon percentage is the largest. The second barrier insulating film 165 may serve as an etch stopper film.

A third interlayer insulating film 170 may be disposed on the second barrier insulating film 165. The third interlayer insulating film 170 may contact the second barrier insulating film 165.

The third interlayer insulating film 170 may include, for example, at least one of silicon oxide, silicon nitride, and silicon oxynitride.

The third interlayer insulating film 170 may include a third line trench 310t. The third line trench 310t may extend through the second barrier insulating film 165.

The third line trench 310t may expose a portion of the second line structure 210. The third line trench 310t may include a third via trench 310V_t and a third wire line trench 310L_t. The third wire line trench 310L_t may extend in an elongated manner in one direction. The third wire line trench 310L_t may extend to a upper surface of the third interlayer insulating film 170. The third via trench 310V_t may be formed on a bottom surface of the third wire line trench 310L_t.

For example, the bottom surface of the third line trench 310t may be a bottom surface of the third via trench 310V_t. The bottom surface of the third line trench 310t may be defined by the second line structure 210. For example, the bottom surface of the third via trench 310V_t may be defined by the second line structure 210.

A sidewall of the third line trench 310t may include a sidewall and a bottom surface of the third wire line trench 310L_t, and a sidewall of the third via trench 310V_t. The sidewall and the bottom surface of the third wire line trench 310L_t may be defined by the third interlayer insulating film 170. The sidewall of the third via trench 310V_t may be defined by the third interlayer insulating film 170 and the second barrier insulating film 165.

A third line structure 310 may be disposed in the third line trench 310t. The third line structure 310 may fill the third line trench 310t. The third line structure 310 may be disposed in the third interlayer insulating film 170.

The third line structure 310 is disposed on the second line structure 210. The third line structure 310 may be connected to the second line structure 210.

The third line structure 310 includes a third wire line 310L and a third via 310V. The third via 310V is connected to the third wire line 310L. The third via 310V may connect the third wire line 310L and the second line structure 110 to each other.

The third line structure 310 fills the third via trench 310V_t and the third wire line trench 310L_t. The third wire line 310L is disposed in the third wire line trench 310L_t. The third via 310V is disposed in the third via trench 310V_t.

The third wire line 310L is disposed at a third metal level different from the second metal level. The third wire line 310L is disposed at the third metal level higher than the second metal level.

The third line structure 310 may include a third barrier conductive film 311 and a third filling conductive film 312. The third barrier conductive film 311 may be disposed between the third interlayer insulating film 170 and the third filling conductive film 312.

The third barrier conductive film 311 may extend along and on a sidewall and a bottom surface of the third line trench 310t. The third barrier conductive film 311 may extend along and on a sidewall and a bottom surface of the third wire line trench 310L_t and a sidewall and a bottom surface of the third via trench 310V_t.

The second filling conductive film 312 is disposed on the third barrier conductive film 311. The third filling conductive film 312 may fill the rest of the third line trench 310t.

A width in a length direction of the third wire line 310L is illustrated as being constant. However, the present disclosure is not limited thereto. Unlike what is illustrated, the width in the length direction of the third wire line 310L may decrease as the line 310L extends away from the upper surface of the third interlayer insulating film 170.

Each of the first barrier conductive film 111, the second barrier conductive film 211 and the third barrier conductive film 311 may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In the semiconductor device according to some example embodiments, the two-dimensional material may be a metallic material and/or a semiconductor material. The two-dimensional material may include two-dimensional allotrope or two-dimensional compound. For example, the two-dimensional material may include, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, the above-described two-dimensional materials are only listed by way of example. The two-dimensional material that may be included in the semiconductor device of the present disclosure is not limited to the above-described materials.

Each of the first filling conductive film 112, the second filling conductive film 212 and the third filling conductive film 312 may include, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, V2AlC and CrAlC. However, the present disclosure is not limited thereto.

It is shown that there is no additional line structure between the first line structure 110 and the second line structure 210. However, the present disclosure is not limited thereto. Unlike what is illustrated, at least one line structure may be disposed between the first line structure 110 and the second line structure 210. An additional line structure including a wire line and a via, an additional interlayer insulating film, and an additional barrier insulating film may be disposed between the first line structure 110 and the second line structure 210.

Further, although it is illustrated that there is no additional line structure between the second line structure 210 and the third line structure 310, the present disclosure is not limited thereto. Unlike what is illustrated, at least one line structure may be disposed between the second line structure 210 and the third line structure 310. An additional line structure including a wire line and a via, an additional interlayer insulating film, and an additional barrier insulating film may be disposed between the second line structure 210 and the third line structure 310.

The first line structure 110, the second wire line 210L, and the third wire line 310L are illustrated as extending in an elongated manner in the same direction. However, this is only for convenience of illustration. The disclosure is not limited thereto.

Hereinafter, the second interlayer insulating film 160 will be described.

The second interlayer insulating film 160 may include a low dielectric constant material to reduce coupling phenomenon between lines. A dielectric constant of the low-k material has a value smaller than 3.9 which is a dielectric constant of silicon oxide. In order to further lower the dielectric constant of the insulating material, the second interlayer insulating film 160 may include pores such as gas-filled or air-filled cavities in the insulating material. The second interlayer insulating film 160 includes a plurality of pores 160AG. The pore 160AG included in the second interlayer insulating film 160 may be surrounded with the insulating material constituting a matrix of the second interlayer insulating film 160.

The second interlayer insulating film 160 may include, for example, at least one of Fluorinated TetraEthylOrthoSilicate (FTEOS), Hydrogen SilsesQuioxane (HSQ), MethylSilsesQuioxane (MQS), CDO (Carbon Doped silicon Oxide), hydrogen doped silicon oxide, polyimide nanofoams such as polypropylene oxide, OSG (Organo Silicate Glass), silica aerogels, silica xerogels, mesoporous silica, aromatic polymer, and a combination thereof. However, the present disclosure is not limited thereto.

The second interlayer insulating film 160 may include a bonding area 160_BF, a transition area 160_TR, and a low dielectric constant area 160_LK. The bonding area 160_BF contacts the first barrier insulating film 155. The transition area 160_TR is disposed on the bonding area 160_BF. The low dielectric constant area 160_LK is disposed on the transition area 160_TR. The low dielectric constant area 160_LK includes the upper surface 160US of the second interlayer insulating film.

As the transition area 160_TR extends away from the first barrier insulating film 155, a carbon concentration in the transition area 160_TR increases. The carbon concentration in the bonding area 160_BF is lower than an average carbon concentration in the transition area 160_TR. A carbon concentration of the low dielectric constant area 160_LK is greater than the average carbon concentration of the transition area 160_TR.

A low dielectric constant material having a high carbon concentration may not be well formed on the first barrier insulating film 155. In order to increase a bonding force between the second interlayer insulating film 160 and the first barrier insulating film 155, the bonding area 160_BF may be disposed on the first barrier insulating film 155. In order to form the low dielectric constant area 160_LK having a high carbon concentration, the transition area 160_TR of which the carbon concentration is gradually increased may be formed on the bonding area 160_BF.

The second interlayer insulating film 160 may include a non-damaged area 160B, a first damaged area 160DR_1, a second damaged area 160DR_2, and a third damaged area 160DR_3. Each of the first damaged area 160DR_1, the second damaged area 160DR_2, and the third damaged area 160DR_3 may be a damaged portion of the second interlayer insulating film 160. The second interlayer insulating film 160 may be damaged in a process of forming the second line trench 210t or the second line structure 210.

The first damaged area 160DR_1 extends along and on the upper surface 160US of the second interlayer insulating film. In other words, the first damaged area 160DR_1 may extend along and on a bottom surface 166BS of the inserted insulating film 166.

The second damaged area 160DR_2 may extend along and on sidewall 210_SW of the second wire line 210L. The third damaged area 160DR_3 may extend along and on a bottom surface 210_BS of the second wire line 210L.

For example, a thickness t12 of the second damaged area 160DR_2 is greater than a thickness t11 of the first damaged area 160DR_1. The thickness t12 of the second damaged area 160DR_2 may be smaller than or equal to the thickness t13 of the third damaged area 160DR_3.

In FIG. 3, a carbon concentration in the second damaged area 160DR_2 is lower than that in the non-damaged area 160B. That is, as the carbon concentration of the second damaged area 160DR_2 decreases, a dielectric constant of the second damaged area 160DR_2 increases.

When the second interlayer insulating film 160 including the low dielectric constant material is damaged, the dielectric constant of the damaged portion increases. That is, an overall dielectric constant of the second interlayer insulating film 160 may increase.

When a manufacturing process for forming the second line structure 210 proceeds without the inserted insulating film 166, the thickness t11 of the first damaged area 160DR_1 increases. The increase in the thickness t11 of the first damaged area 160DR_1 results in increase in the dielectric constant of the second interlayer insulating film 160. For example, a dielectric constant of a portion of the second interlayer insulating film 160 surrounding the second wire line 210L increases. As the dielectric constant of the portion of the second interlayer insulating film 160 surrounding the second wire line 210L increases, a RC delay between the second wire lines 210L disposed at the second metal level may increase.

However, according to the present disclosure, the inserted insulating film 166 is formed along the upper surface 160US of the second interlayer insulating film. Thus, the inserted insulating film 166 may prevent or reduce the damage to a upper portion of the second interlayer insulating film 160 during the manufacturing process. Accordingly, the thickness t11 of the first damaged area 160DR_1 is reduced.

Accordingly, the dielectric constant of the portion of the second interlayer insulating film 160 surrounding the second wire line 210L is reduced.

The plurality of pores 160AG may include a first pore 160AG_1 and a second pore 160AG_2. For example, the second pore 160AG_2 may be closer to the inserted insulating film 166 than the first pore 160AG_1.

In one example, each of the plurality of pores 160AG may not contain a nitrogen residue inside each of the pores 160AG. In FIG. 4, a nitrogen concentration in the first pore 160AG_1 and a nitrogen concentration in the second pore 160AG_2 may be zero.

In one example, each of the plurality of pores 160AG may not contain nitrogen-containing inside each of the pores 160AG. In FIG. 4, a nitrogen concentration in the first pore 160AG 1 and a nitrogen concentration in the second pore 160AG_2 may be zero.

In another example, each of at least some of the plurality of pores 160AG may contain nitrogen-containing therein. In FIG. 5, the first pore 160AG_1 may contain nitrogen-containing in the first pore 160AG_1. The second pore 160AG_2 does not contain the nitrogen-containing in the second pore 160AG 2. In FIG. 6, each of the first pore 160AG_1 and the second pore 160AG_2 may contain the nitrogen-containing therein. In this regard, the nitrogen concentration in the second pore 160AG_2 may be lower than the nitrogen concentration in the first pore 160AG_1.

For example, each of the first interlayer insulating film 150 and the third interlayer insulating film 170 may not include the pore 160AG unlike the second interlayer insulating film 160. Unlike what is shown, at least one of the first interlayer insulating film 150 and the third interlayer insulating film 170 may include the pore 160AG as the second interlayer insulating film 160.

Unlike what is shown, when the first interlayer insulating film 150 includes the plurality of pores 160AG as the second interlayer insulating film 160, an insulating film such as the inserted insulating film 166 may be additionally disposed between the first barrier insulating film 155 and the first interlayer insulating film 150. Further, the first barrier insulating film 155 may include a silicon nitride-based material as the second barrier insulating film 165.

Figure 7:
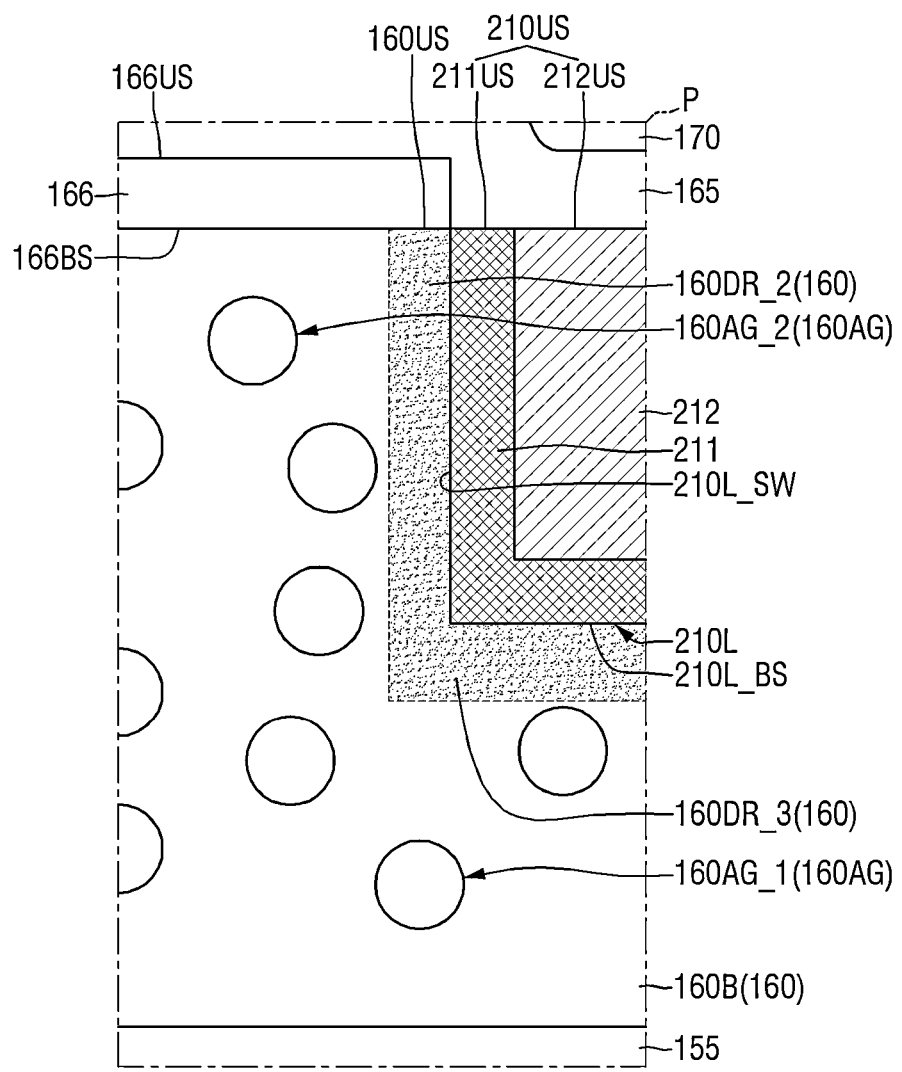
FIG. 7 is a diagram for illustrating a semiconductor device according to an example embodiment.
Figure 8:
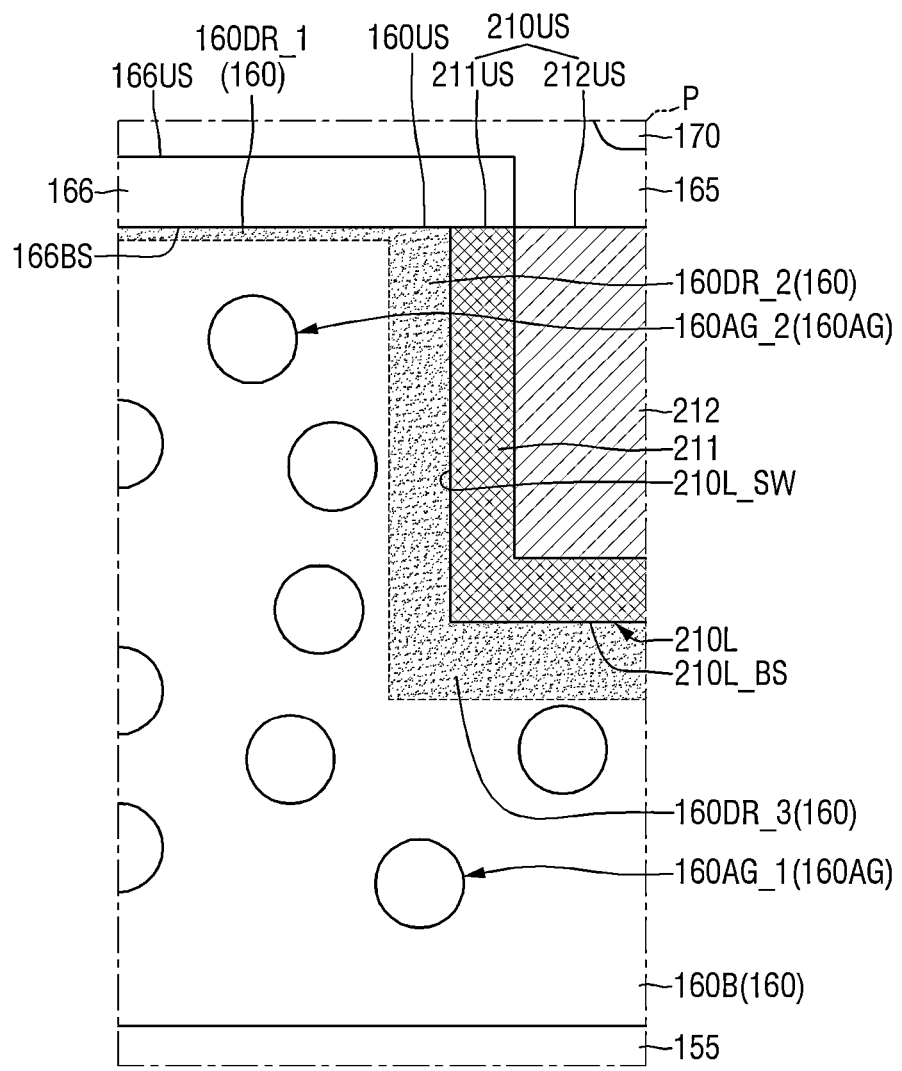
FIG. 8 is a diagram for illustrating a semiconductor device according to an example embodiment.

FIG. 7 is a diagram for illustrating a semiconductor device according to an example embodiment. FIG. 8 is a diagram for illustrating a semiconductor device according to an example embodiment. For convenience of illustration, following description is based on differences thereof from those described using FIG. 1 to FIG. 6.

For reference, FIG. 7 and FIG. 8 are enlarged views of a 'P' portion of FIG. 1.

Referring to FIG. 7, in the semiconductor device according to an example embodiment, the second interlayer insulating film 160 does not include the first damaged area 160DR_1 extending along and on the upper surface 160US of the second interlayer insulating film.

The non-damaged area 160B may contact the bottom surface 166BS of the inserted insulating film. The second damaged area 160DR_2 may extend to the bottom surface 166B S of the inserted insulating film. However, the present disclosure is not limited thereto.

When the second interlayer insulating film 160 does not include the first damaged area 160DR_1, a thickness of the first damaged area 160DR_1 is 0. In this case, the first damaged area 160DR_1 having a thickness of 0 may be disposed along the upper surface 160US of the second interlayer insulating film. That is, in the semiconductor device according to an example embodiment of the present disclosure, a value of the thickness (t11 in FIG. 2) of the first damaged area 160DR_1 includes 0.

Referring to FIG. 8, in the semiconductor device according to an example embodiment, the inserted insulating film 166 may extend along and on a portion of the upper surface 210US of the second line structure.

The inserted insulating film 166 extends along and on the upper surface 211US of the second barrier conductive film 211. The inserted insulating film 166 does not extend along and on the upper surface 212US of the second filling conductive film 212.

The inserted insulating film 166 covers the upper surface 211US of the second barrier conductive film 211. The inserted insulating film 166 does not cover the upper surface 212US of the second filling conductive film 212.

Figure 9:
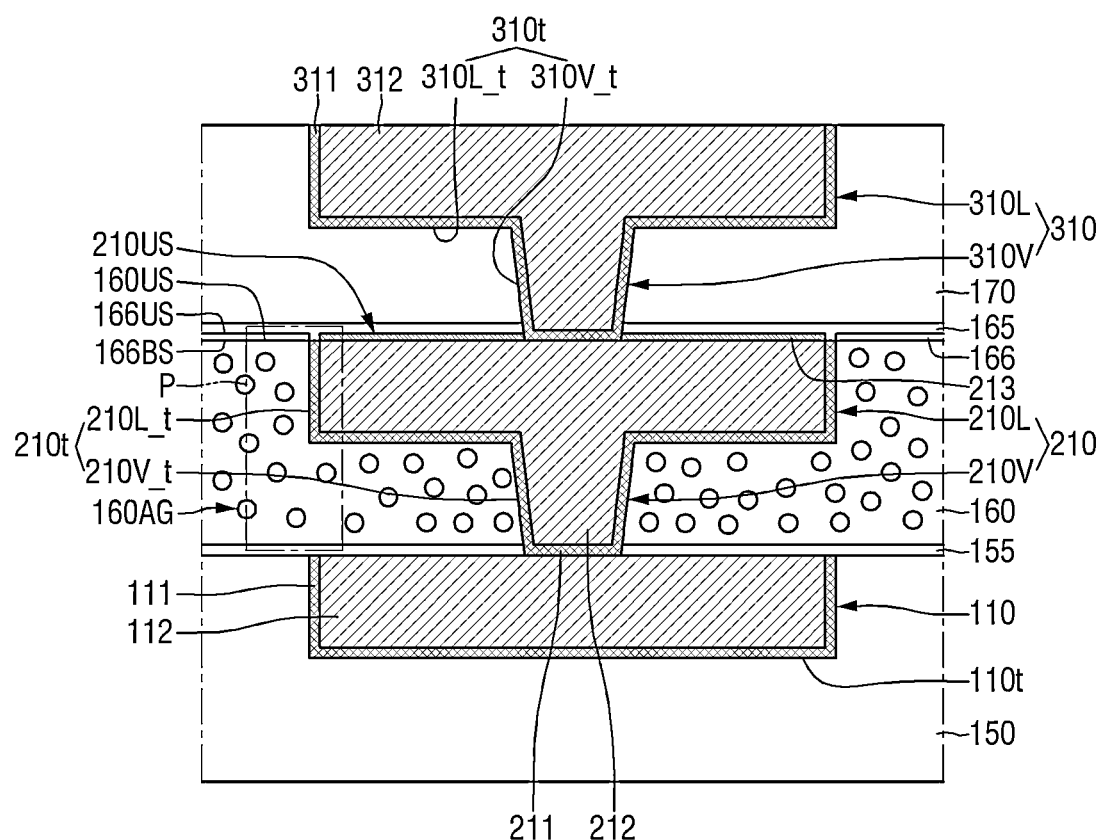
FIGS. 9 and 10 are diagrams for illustrating a semiconductor device according to an example embodiment.
Figure 10:
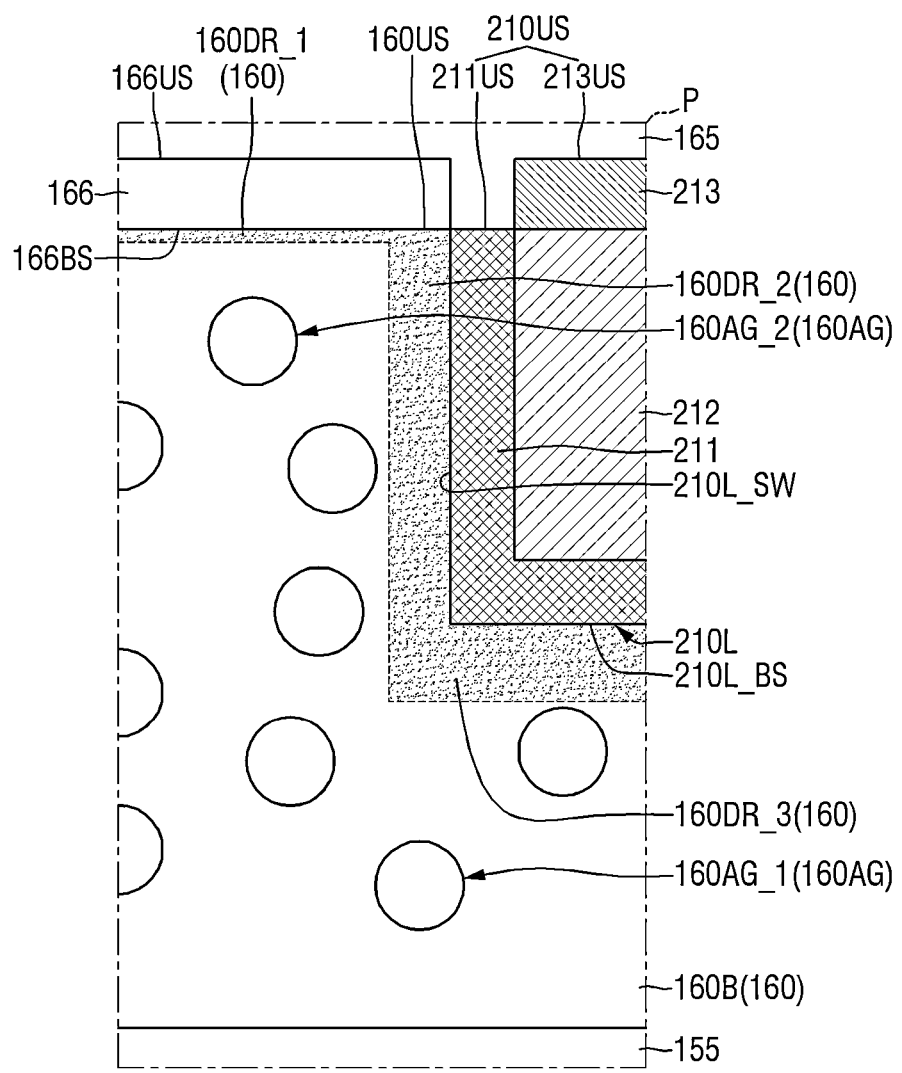
Figure 11:
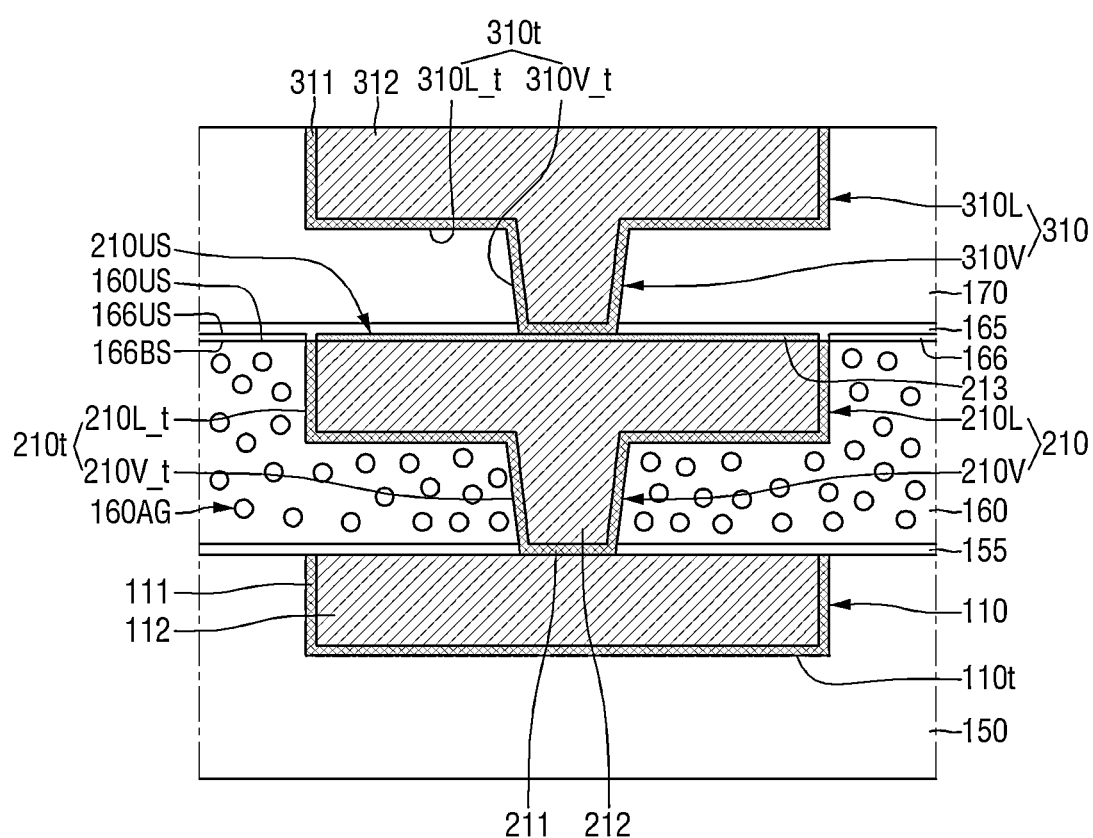
FIG. 11 is a diagram for illustrating a semiconductor device according to an example embodiment.
Figure 12:
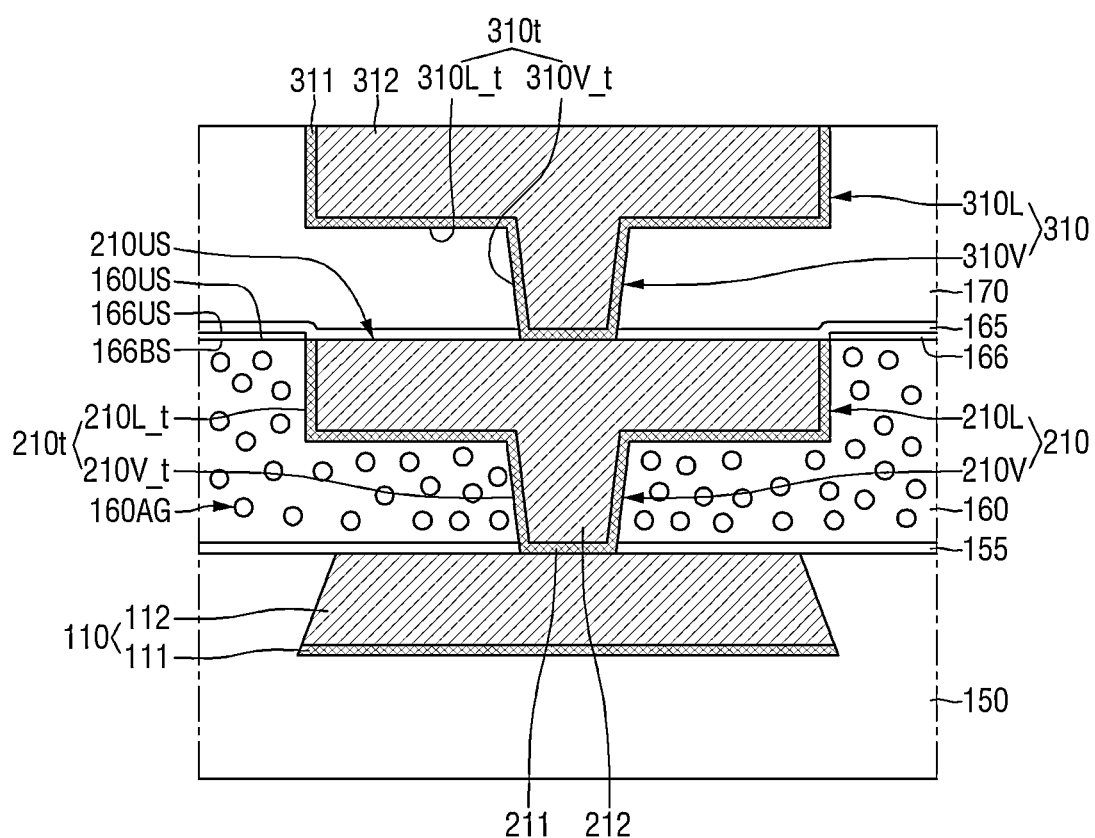
FIG. 12 is a diagram for illustrating a semiconductor device according to an example embodiment.

FIGS. 9 and 10 are diagrams for illustrating a semiconductor device according to an example embodiment. FIG. 11 is a diagram for illustrating a semiconductor device according to an example embodiment. FIG. 12 is a diagram for illustrating a semiconductor device according to an example embodiment. For convenience of illustration, following description is based on differences thereof from those described with reference to FIG. 1 to FIG. 6.

For reference, FIG. 10 is an enlarged view of a 'P' portion of FIG. 9.

Referring to FIG. 9 to FIG. 11, in the semiconductor device according to some example embodiments, the second line structure 210 may include the second barrier conductive film 211, the second filling conductive film 212, and a second capping conductive film 213.

The second capping conductive film 213 is disposed on the second filling conductive film 212. The second capping conductive film 213 extends along and on the upper surface 212US of the second filling conductive film 212.

For example, the second capping conductive film 213 may not cover the upper surface 211US of the second barrier conductive film 211. The upper surface 210US of the second line structure 210 may be defined by the second barrier conductive film 211 and the second capping conductive film 213. The upper surface 210US of the second line structure may include the upper surface 211US of the second barrier conductive film 211 and an upper surface 213US of the second capping conductive film 213. The second barrier insulating film 165 may contact the upper surface 211US of the second barrier conductive film 211 and the upper surface 213US of the second capping conductive film 213.

Unlike what is shown, the second capping conductive film 213 may cover the upper surface 211US of the second barrier conductive film 211. The upper surface 210US of the second line structure may be defined by the second capping conductive film 213. The second barrier insulating film 165 may contact the upper surface 213US of the second capping conductive film 213.

The second capping conductive film 213 may include, for example, at least one of cobalt (Co), ruthenium (Ru), and manganese (Mn). However, the present disclosure is not limited thereto.

In FIG. 9 and FIG. 10, at a position where the second line structure 210 is connected with another line structure, the second capping conductive film 213 does not cover the upper surface 212US of the second filling conductive film 212. For example, the third via 310V may extend through the second capping conductive film 213, so that the third line structure 310 may be connected to the second line structure 210.

In FIG. 10 and FIG. 11, at a position where the second line structure 210 connects with another line structure, the second capping conductive film 213 covers the upper surface 212US of the second filling conductive film. For example, the third via 310V does not extend through the second capping conductive film 213.

Referring to FIG. 12, in the semiconductor device according to an example embodiment, as the first line structure 110 extends away from the upper surface of the first interlayer insulating film 150, a width in a length direction of the first line structure 110 may increase.

The first line structure 110 may be formed using, for example, a subtractive process. In other words, a conductive film acting as a base of the first line structure 110 is formed and then a mask pattern is formed on the conductive film. Using the mask pattern as a mask, the conductive film is etched. Thus, the first line structure 110 may be formed.

The first line structure 110 is illustrated as including the first barrier conductive film 111 and the first filling conductive film 112. However, the present disclosure is not limited thereto. In one example, unlike what is shown, a hard mask pattern may be disposed along the upper surface of the first filling conductive film 112. In another example, unlike what is shown, a passivation film may be disposed along a sidewall of the first filling conductive film 112. In another example, the first barrier conductive film 111 may be omitted.

Figure 13:
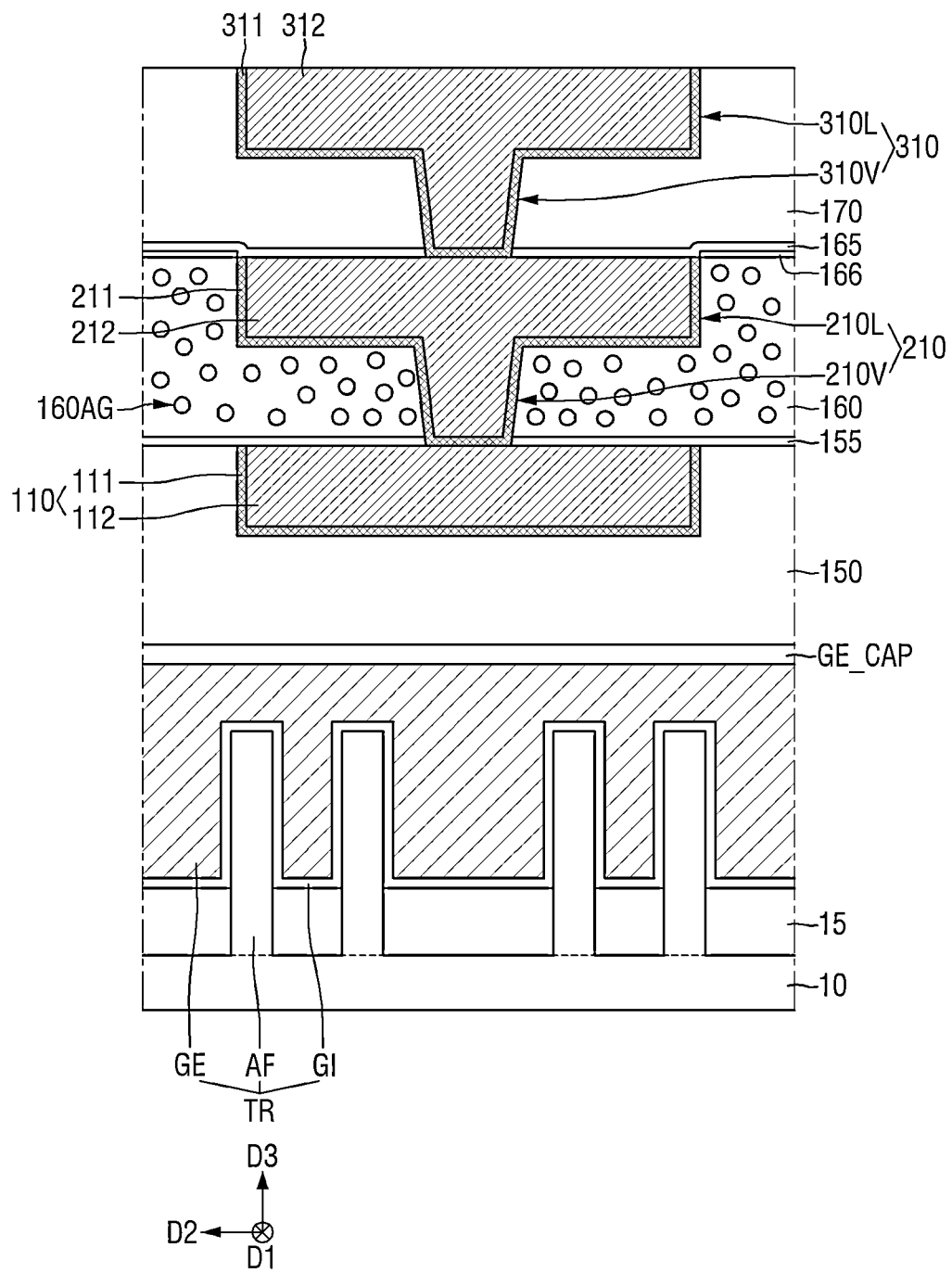
FIG. 13 is a diagram for illustrating a semiconductor device according to an example embodiment.

FIG. 13 is a diagram for illustrating a semiconductor device according to an example embodiment. For convenience of illustration, following description is based on differences thereof from those described with reference to FIG. 1 to FIG. 6.

FIG. 13 shows an example in which the semiconductor device is cut along a first gate electrode GE.

In FIG. 13, it is shown that a fin-shaped pattern AF extends in a first direction D1 and the first gate electrode GE extends in a second direction D2. However, the present disclosure is not limited thereto. Each of the first line structure 110, the second wire line 210L, and the third wire line 310L is illustrated as extending in an elongated manner in the first direction D1. However, the disclosure is not limited thereto.

Referring to FIG. 13, the semiconductor device according to an example embodiment may include a transistor TR disposed between a substrate 10 and the first line structure 110.

The substrate 10 may be a silicon substrate or an SOI (silicon-on-insulator). In some example embodiments, the substrate 10 may include silicon germanium, SGOI (silicon germanium on insulator), indium antimonide, lead telluride compound, indium arsenide, indium phosphide, gallium arsenide, or gallium antimonide. However, the present disclosure is not limited thereto.

The transistor TR may include the fin-shaped pattern AF, the first gate electrode GE on the fin-shaped pattern AF, and a first gate insulating film GI between the fin-shaped pattern AF and the first gate electrode GE.

Although not shown, the transistor TR may include a source/drain pattern disposed at each of both opposing sides of the first gate electrode GE.

The fin-shaped pattern AF may protrude from the substrate 10. The fin-shaped pattern AF may extend in the first direction D1. The fin-shaped pattern AF may be a portion of the substrate 10, or may include an epitaxial layer grown from the substrate 10. The fin-shaped pattern AF may include, for example, silicon or germanium as an elemental semiconductor material. Further, the fin-shaped pattern AF may include a compound semiconductor. For example, the compound semiconductor may include a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto. The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

The field insulating film 15 may be formed on the substrate 10. The field insulating film 15 may be formed on a portion of a sidewall of the fin-shaped pattern AF. The fin-shaped pattern AF may protrude upwardly beyond a upper surface of the field insulating film 15. The field insulating film 15 may include, for example, an oxide film, a nitride film, an oxynitride film, or a combination thereof.

The first gate electrode GE may be disposed on the fin-shaped pattern AF. The first gate electrode GE may extend in the second direction D2. The first gate electrode GE may intersect the fin-shaped pattern AF.

The first gate electrode GE may include, for example, at least one of metal, conductive metal nitride, conductive metal carbonitride, conductive metal carbide, metal silicide, doped semiconductor material, conductive metal oxynitride, and conductive metal oxide.

The first gate insulating film GI may be disposed between the first gate electrode GE and the fin-shaped pattern AF and between the first gate electrode GE and the field insulating film 15. The first gate insulating film GI may include, for example, silicon oxide, silicon oxynitride, silicon nitride, or a high dielectric constant material having a higher dielectric constant than that of silicon oxide. The high dielectric constant material may include, for example, at least one of boron nitride, metal oxide, and metal silicon oxide.

The semiconductor device according to some example embodiments may include an NC (negative capacitance) FET using a negative capacitor. For example, each of the main gate insulating film 430a and the dummy gate insulating film 430b may include a ferroelectric material film having ferroelectric characteristics and a paraelectric material film having paraelectric characteristics.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, the first gate insulating film GI may include one ferroelectric material film. In another example, the first gate insulating film GI may include a plurality of ferroelectric material films spaced apart from each other. The first gate insulating film GI may have a stack film structure in which a plurality of ferroelectric material films and a plurality of paraelectric material films are alternately stacked with each other.

A gate capping pattern GE_CAP may be disposed on the first gate electrode GE. The first line structure 110 may be disposed on the first gate electrode GE. It is illustrated that the first line structure 110 is not connected to the first gate electrode GE. However, the present disclosure is not limited thereto. One of the first line structures 110 may be connected to the first gate electrode GE.

Figure 14:
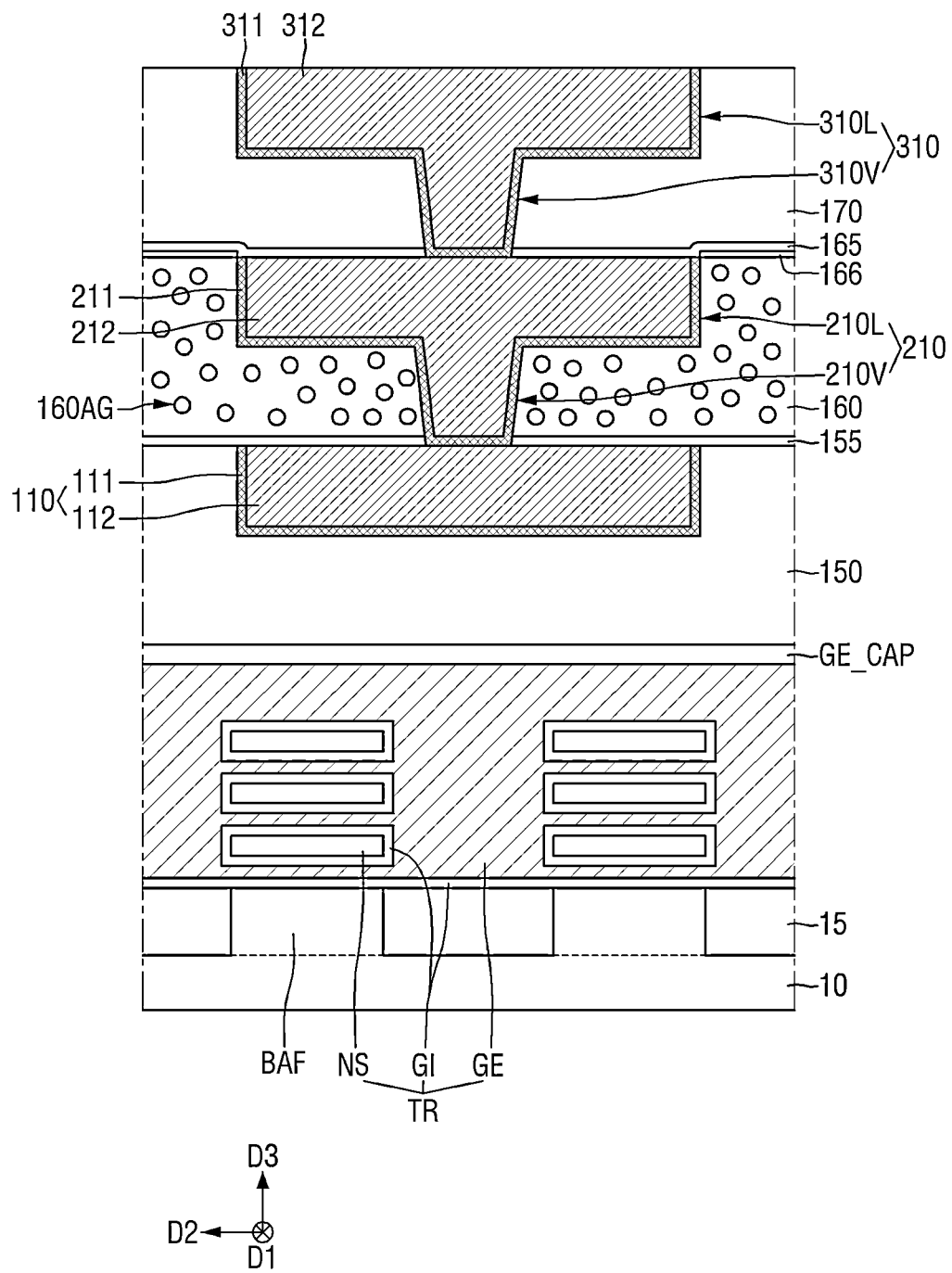
FIG. 14 is a diagram for illustrating a semiconductor device according to an example embodiment.

FIG. 14 is a diagram for illustrating a semiconductor device according to an example embodiment. For convenience of illustration, following description is based on differences thereof from descriptions using FIG. 13.

Referring to FIG. 14, in the semiconductor device according to an example embodiment, a transistor TR may include a nanosheet NS, the first gate electrode GE surrounding the nanosheet NS, and the first gate insulating film GI between the nanosheet NS and the first gate electrode GE.

The nanosheet NS may be disposed on a lower fin-shaped pattern BAF. The nanosheet NS may be spaced apart from the lower fin-shaped pattern BAF in the third direction D3. The transistor TR is shown as including three nanosheets NS spaced apart from each other in the third direction D3. However, the present disclosure is not limited thereto. The number of the nanosheets NS arranged in the third direction D3 and disposed on the lower fin-shaped pattern BAF may be at least four or may be smaller than three.

Each of the lower fin-shaped pattern BAF and the nanosheet NS may include, for example, silicon or germanium as an elemental semiconductor material. Each of the lower fin-shaped pattern BAF and the nanosheet NS may include a compound semiconductor. For example, each of the lower fin-shaped pattern BAF and the nanosheet NS may include a group IV-IV compound semiconductor or a group III-V compound semiconductor. The lower fin-shaped pattern BAF and the nanosheet NS may include the same material or may include different materials.

Figure 15:
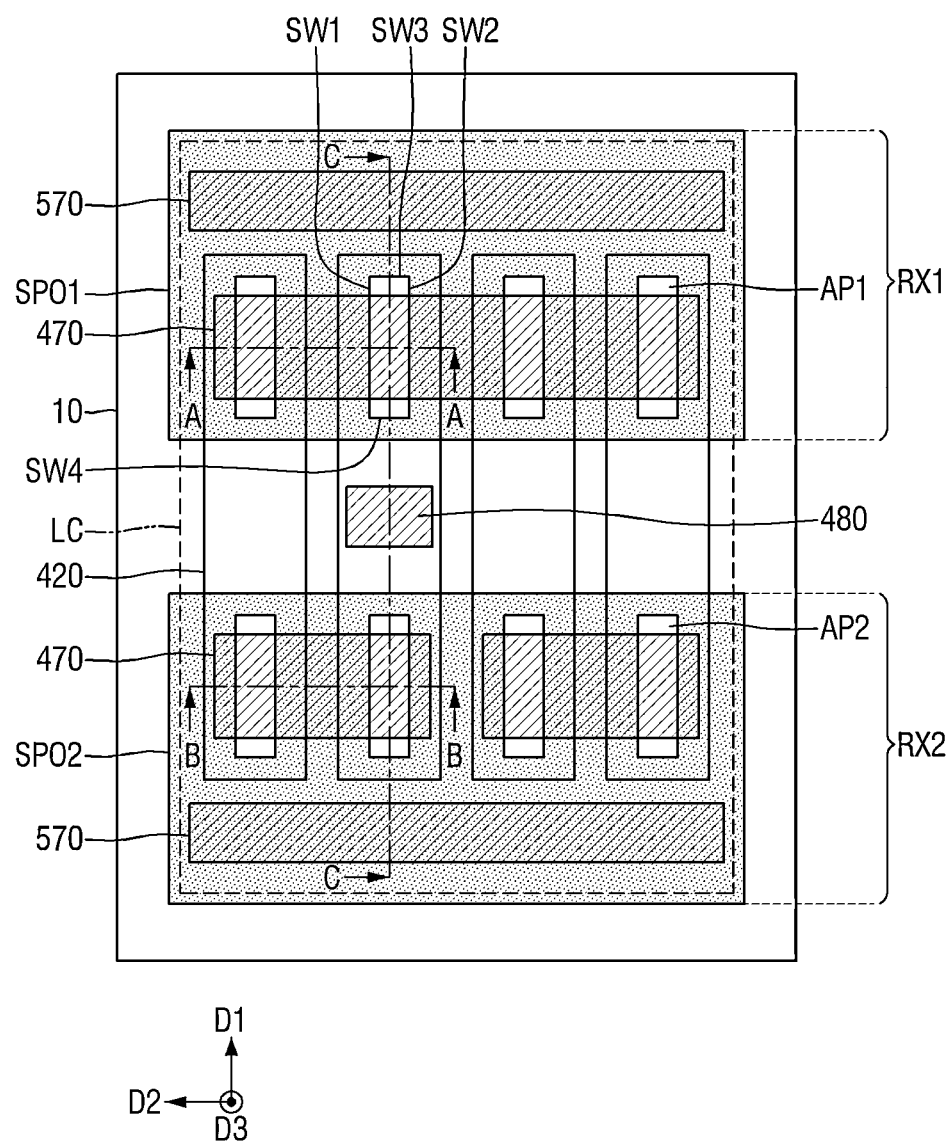
FIG. 15 to FIG. 17 are diagrams for illustrating a semiconductor device according to an example embodiment.
Figure 16:
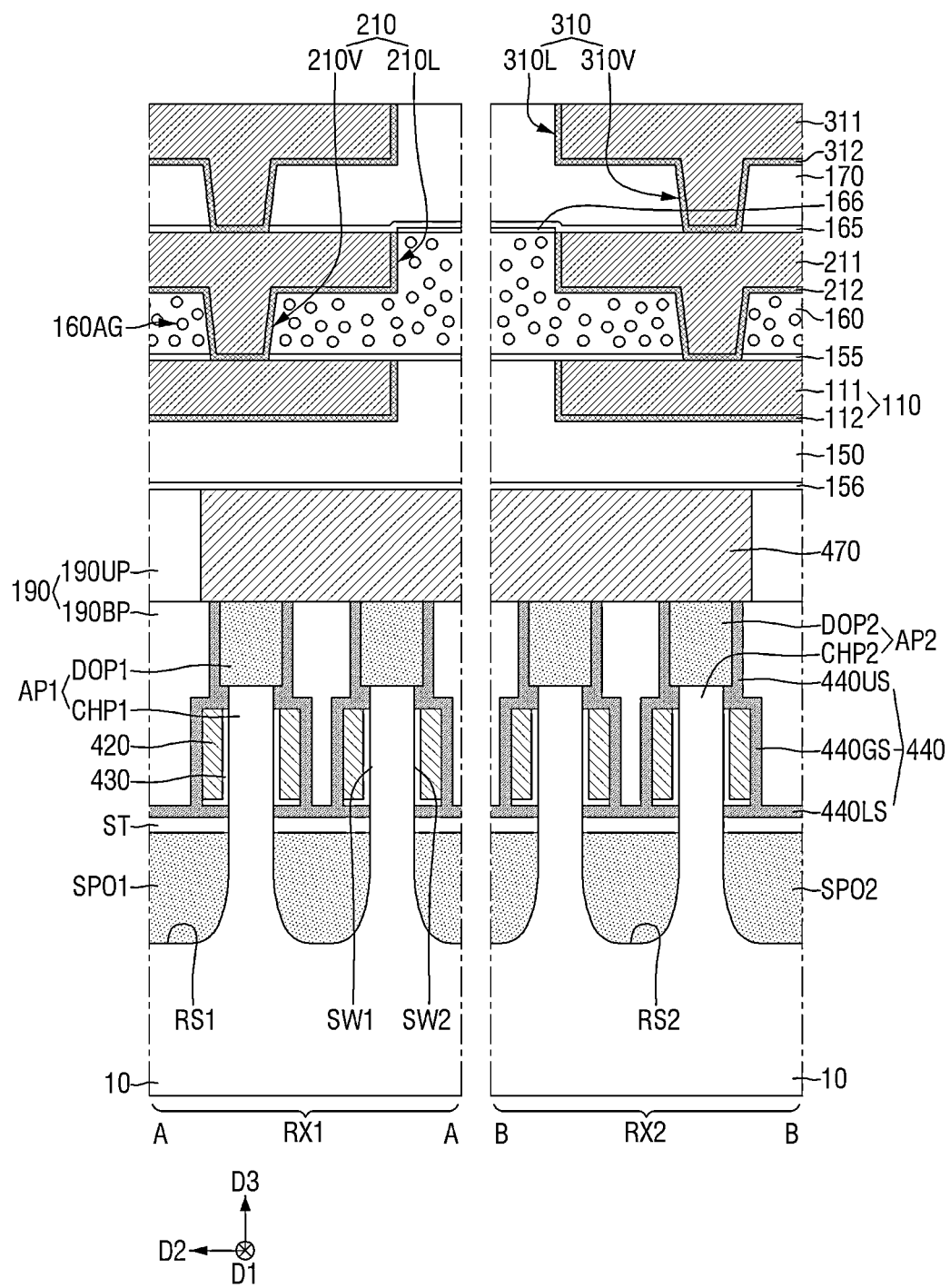
Figure 17:
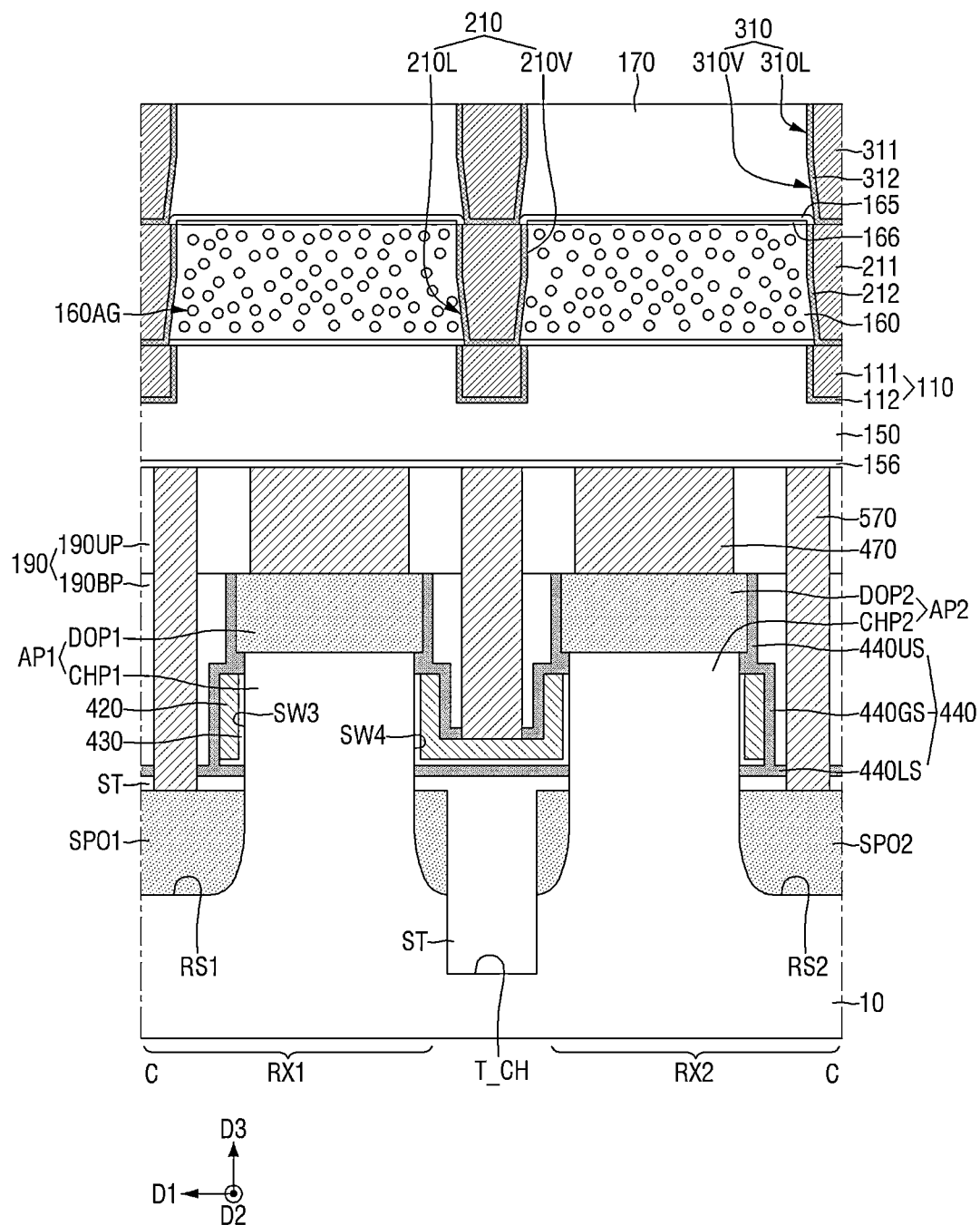

FIG. 15 to FIG. 17 are diagrams for illustrating a semiconductor device according to an example embodiment. For reference, FIG. 15 is a plan view for illustrating a semiconductor device according to an example embodiment. FIG. 16 is a cross-sectional view taken along A-A and B-B of FIG. 15. FIG. 17 is a cross-sectional view taken along C-C of FIG. 15.

Referring to FIG. 15 to FIG. 17, a logic cell LC may be disposed on a substrate 10. The logic cell LC may mean a logic element (for example, an inverter or a flip-flop) that performs a specific function. The logic cell LC may include vertical transistors (Vertical FETs) constituting a logic element, and lines connecting the vertical transistors to each other.

The logic cell LC on the substrate 10 may include a first active area RX1 and a second active area RX2. For example, the first active area RX1 may be a PMOSFET area, while the second active area RX2 may be an NMOSFET area. The first and second active areas RX1 and RX2 may be defined by a trench T_CH formed in a upper of the substrate 10. The first and second active areas RX1 and RX2 may be spaced apart from each other in the first direction D1.

A first lower epitaxial pattern SPO1 may be disposed on the first active area RX1, while a second lower epitaxial pattern SPO2 may be disposed on the second active area RX2. In the plan view, the first lower epitaxial pattern SPO1 may overlap with the first active area RX1, while the second lower epitaxial pattern SPO2 may overlap with the second active area RX2. The first and second lower epitaxial patterns SPO1 and SPO2 may be epitaxial patterns formed using a selective epitaxial growth process. The first lower epitaxial pattern SPO1 may be disposed in a first recess area RS1 of the substrate 10, while the second lower epitaxial pattern SPO2 may be disposed in a second recess area RS2 of the substrate 10.

The first active patterns AP1 may be disposed on the first active area RX1, while the second active patterns AP2 may be disposed on the second active area RX2. Each of the first and second active patterns AP1 and AP2 may have a vertically protruding fin shape. In the plan view, each of the first and second active patterns AP1 and AP2 may have a bar shape extending in the first direction D1. The first active patterns AP1 may be arranged along the second direction D2, while the second active patterns AP2 may be arranged along the second direction D2.

Each of the first active patterns AP1 may include a first channel pattern CHP1 vertically protruding from the first lower epitaxial pattern SPO1 and a first upper epitaxial pattern DOP1 on the first channel pattern CHP1. Each of the second active patterns AP2 may include a second channel pattern CHP2 vertically protruding from the second lower epitaxial pattern SPO2 and a second upper epitaxial pattern DOP2 on the second channel pattern CHP2.

An element isolation film ST may be disposed on the substrate 10 so as to fill the trench T_CH. The element isolation film ST may cover upper surfaces of the first and second lower epitaxial patterns SPO1 and SPO2. The first and second active patterns AP1 and AP2 may protrude vertically upwardly beyond the element isolation film ST.

A plurality of second gate electrodes 420 extending parallel to each other and in the first direction D1 may be disposed on the device isolation film ST. The second gate electrodes 420 may be arranged along the second direction D2. The second gate electrode 420 may surround the first channel pattern CHP1 of the first active pattern AP1, and may surround the second channel pattern CHP2 of the second active pattern AP2. For example, the first channel pattern CHP1 of the first active pattern AP1 may have first to fourth sidewalls SW1 to SW4. The first and second sidewalls SW1 and SW2 may face each other in the second direction D2, while the third and fourth sidewalls SW3 and SW4 may face each other in the first direction D1. The second gate electrode 420 may be disposed on the first to fourth sidewalls SW1 to SW4. In other words, the second gate electrode 420 may surround the first to fourth sidewalls SW1 to SW4.

The second gate insulating film 430 may be interposed between the second gate electrode 420 and each of the first and second channel patterns CHP1 and CHP2. The second gate insulating film 430 may cover a bottom surface of the second gate electrode 420 and an inner sidewall of the second gate electrode 420. For example, the second gate insulating film 430 may directly cover the first to fourth sidewalls SW1 to SW4 of the first active pattern AP1.

First and second upper epitaxial patterns DOP1 and DOP2 may protrude vertically upwardly beyond the second gate electrode 420. A vertical level of a upper surface of the second gate electrode 420 may be lower than a vertical level of a bottom surface of each of the first and second upper epitaxial patterns DOP1 and DOP2. In other words, each of the first and second active patterns AP1 and AP2 may protrude vertically from the substrate 10 and extend through the second gate electrode 420.

The semiconductor device according to some example embodiments may include vertical transistors in which carriers move in the third direction D3. For example, when a voltage is applied to the second gate electrode 420 and thus the transistor is turned "on", the carriers may move from the lower epitaxial pattern SOP1 and SOP2 to the upper epitaxial patterns DOP1 and DOP2 via the channel patterns CHP1 and CHP2, respectively. In the semiconductor device according to some example embodiments, the second gate electrode 420 may surround an entirety of the sidewalls SW1 to SW4 of the channel patterns CHP1 and CHP2. The transistor according to some example embodiments of the present disclosure may be a three-dimensional electric field effect transistor (e.g., a VFET) having a gate all around structure. Because the gate surrounds the channel, the semiconductor device according to some example embodiments may have excellent electrical characteristics.

A spacer 440 covering the second gate electrodes 420 and the first and second active patterns AP1 and AP2 may be disposed on the device isolation film ST. The spacer 440 may include a silicon nitride film or a silicon oxynitride film. The spacer 440 may include a lower spacer 440LS, an upper spacer 440US, and a gate spacer 440GS between the lower and upper spacers 440LS and 440US.

The lower spacer 440LS may directly cover a upper surface of the element isolation film ST. The second gate electrodes 420 may be spaced apart from the element isolation film ST in the third direction D3 via the lower spacer 440LS. The gate spacer 440GS may cover a upper surface and an outer sidewall of each of the second gate electrodes 420. The upper spacer 440 may cover the first and second upper epitaxial patterns DOP1 and DOP2. However, the upper spacer 440US may not cover upper surfaces of the first and second upper epitaxial patterns DOP1 and DOP2, but may expose the upper surfaces of the first and second upper epitaxial patterns DOP1, DOP2.

A first portion 190BP of a lower interlayer insulating film 190 may be disposed on the spacer 440. A upper surface of the first portion 190BP of the lower interlayer insulating film may be substantially coplanar with the upper surfaces of the first and second upper epitaxial patterns DOP1 and DOP2. A second portion 190UP of the lower interlayer insulating film and the first and second interlayer insulating films 150 and 160 may be sequentially stacked on the first portion 190BP of the lower interlayer insulating film. The first portion 190BP of the lower interlayer insulating film and the second portion 190UP of the lower interlayer insulating film may constitute the lower interlayer insulating film 190. The second portion 190UP of the lower interlayer insulating film may cover the upper surfaces of the first and second upper epitaxial patterns DOP1 and DOP2.

At least one first source/drain contact 470 may extend through the second portion 190UP of the lower interlayer insulating film, and may connect to the first and second upper epitaxial patterns DOP1 and DOP2. At least one second source/drain contact 570 may sequentially extend the lower interlayer insulating film 190, the lower spacer 440LS, and the element isolation film ST, and may connect to the first and second lower epitaxial patterns SPO1 and SPO2. A gate contact 480 sequentially penetrating the second portion 190UP of the lower interlayer insulating film, the first portion 190BP of the lower interlayer insulating film, and the gate spacer 440GS and being connected to the second gate electrode 420 may be provided.

A third barrier insulating film 156 may be additionally disposed between the second portion 190UP of the lower interlayer insulating film and the first interlayer insulating film 150. The third barrier insulating film 156 may serve as an etch stopper film. The third barrier insulating film 156 may include, for example, at least one of silicon nitride (SiN), silicon oxynitride (SiON), silicon oxycarbonitride (SiOCN), silicon boron nitride (SiBN), silicon oxyboronitride (SiOBN), silicon oxycarbide (SiOC), aluminum oxide (AlO), aluminum nitride (AlN), aluminum oxycarbide (AlOC), and combinations thereof.

The first barrier insulating film 155 may be disposed between the first interlayer insulating film 150 and the second interlayer insulating film 160.

The first line structure 110 may be disposed in the first interlayer insulating film 150. The second line structure 210 may be disposed in the second interlayer insulating film 160. The third line structure 310 may be disposed in the third interlayer insulating film 170. The inserted insulating film 166 and the second barrier insulating film 165 are disposed between the second interlayer insulating film 160 and the third interlayer insulating film 170.

Detailed descriptions of the first to third line structures 110, 210, and 310 may be the same or substantially similar to those made above using FIG. 1 to FIG. 12.

FIGS. 18 to 26 are diagrams of intermediate structures of steps for illustrating a method for manufacturing a semiconductor device according to an example embodiment.

FIG. 18 to FIG. 26 are diagrams of intermediate structures of steps for illustrating a method for manufacturing a semiconductor device according to an example embodiment.

Figure 18:
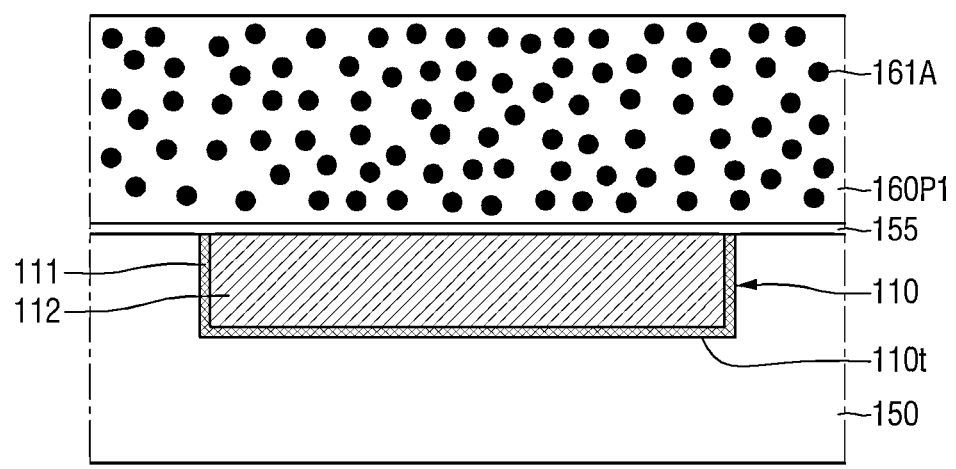
FIGS. 18 to 26 are diagrams of intermediate structures for illustrating a method for manufacturing a semiconductor device according to an example embodiment.

Referring to FIG. 18, the first line structure 110 is formed in the first interlayer insulating film 150.

The first line trench **110*t* is formed in the first interlayer insulating film 150. In the first line trench 110*t*, the first line structure 110 is formed. The first line structure 110 may include the first barrier conductive film 111 and the first filling conductive film 112**.

Subsequently, the first barrier insulating film 155 may be formed on the first interlayer insulating film 150 and the first line structure 110.

A pore insulating mold film 160P1 may be formed on the first barrier insulating film 155. The pore insulating mold film 160P1 may contain a pore inducing material 161A.

Figure 19:
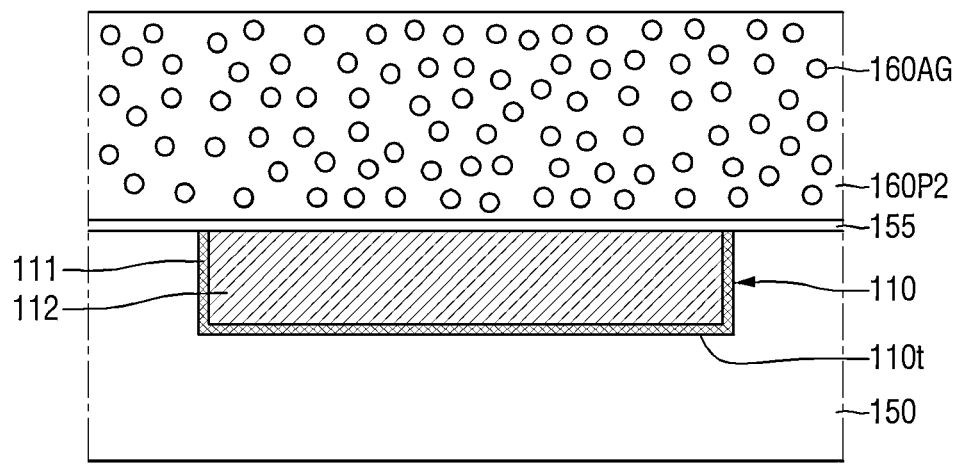

Referring to FIG. 18 and FIG. 19, the pore inducing material 161A may be removed from the pore insulating mold film 160P1, such that a pre-interlayer insulating film 160P2 containing therein the plurality of pores 160AG is formed.

The pre-interlayer insulating film 160P2 is formed on the first barrier insulating film 155.

The pore inducing material 161A may be removed via, for example, UV treatment or heat-treatment. However, the present disclosure is not limited thereto.

While the pore inducing material 161A is removed, the pore insulating mold film 160P1 contracts, such that densification of the pore insulating mold film 160P1 is achieved. That is, the pre-interlayer insulating film 160P2 may be a densified insulating material film.

Figure 20:
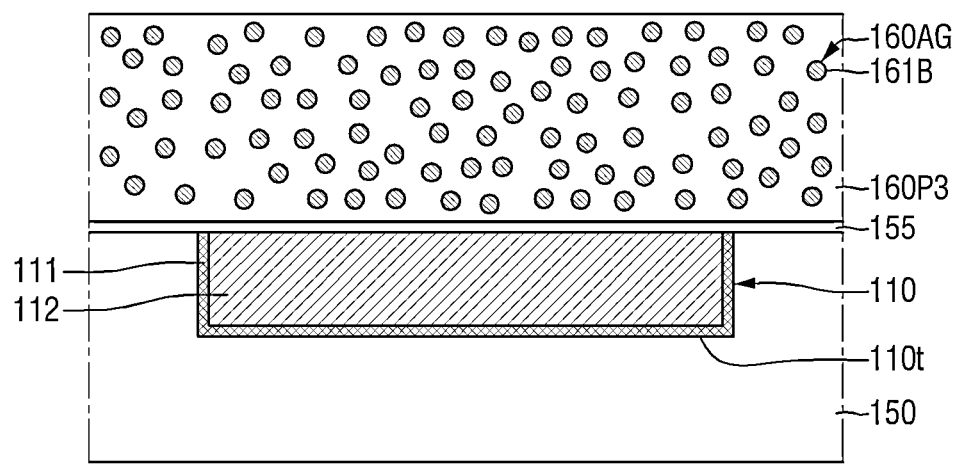

Referring to FIG. 20, a pore filler 161B may fill the plurality of pores 160AG in the pre-interlayer insulating film 160P2.

Thus, a modified interlayer insulating film 160P3 is formed on the first barrier insulating film 155.

The modified interlayer insulating film 160P3 includes the pore filler 161B filling the pores 160AG. Because the modified interlayer insulating film 160P3 includes the pore filler 161B, the modified interlayer insulating film 160P3 has higher mechanical strength than that of the pre-interlayer insulating film 160P2 containing therein the pores 160AG.

The pore filler 161B may be, for example, an organic material including, but not limited to, carbon, oxygen, and nitrogen.

Figure 21:
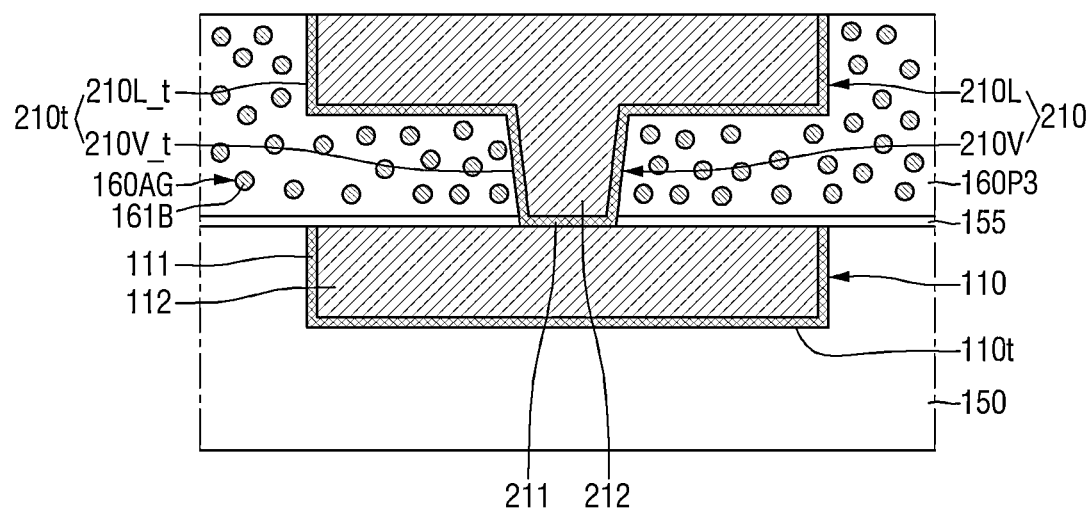

Referring to FIG. 21, the second line structure 210 is formed in the modified interlayer insulating film 160P3.

For example, a mask pattern is formed on the modified interlayer insulating film 160P3. Using the mask pattern, the second line trench 210t is formed in the modified interlayer insulating film 160P3. The second line trench 210t includes the second via trench 210V_t and the second wire line trench 210L_t. The second via trench 210V_t may expose the first line structure 110.

Subsequently, the second line structure 210 is formed in the second line trench 210t. The second line structure 210 includes the second wire line 210L and the second via 210V. While forming the second line structure 210, the mask pattern used to form the second line trench 210t may be removed.

Figure 22:
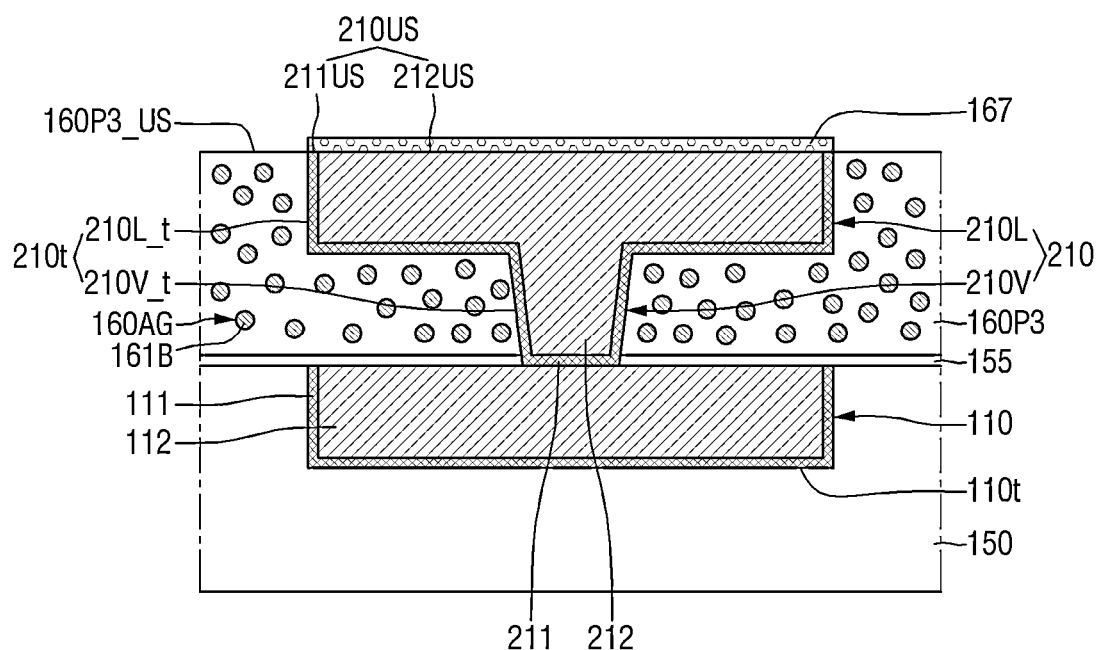

Referring to FIG. 22, a deposition inhibition film 167 may be formed on at least a portion of the upper surface 210US of the second line structure.

For example, the deposition inhibition film 167 may extend along and on the upper surface 210US of the second line structure.

The deposition inhibition film 167 may include an organic material. The deposition inhibition film 167 may be formed on a surface of a conductive material.

The deposition inhibition film 167 may cover the upper surface 211US of the second barrier conductive film 211 and the upper surface 212US of the second filling conductive film 212. Unlike what is shown, the deposition inhibition film 167 may cover the upper surface 212US of the second filling conductive film 212, but may not cover the upper surface 211US of the second barrier conductive film 211.

Figure 23:
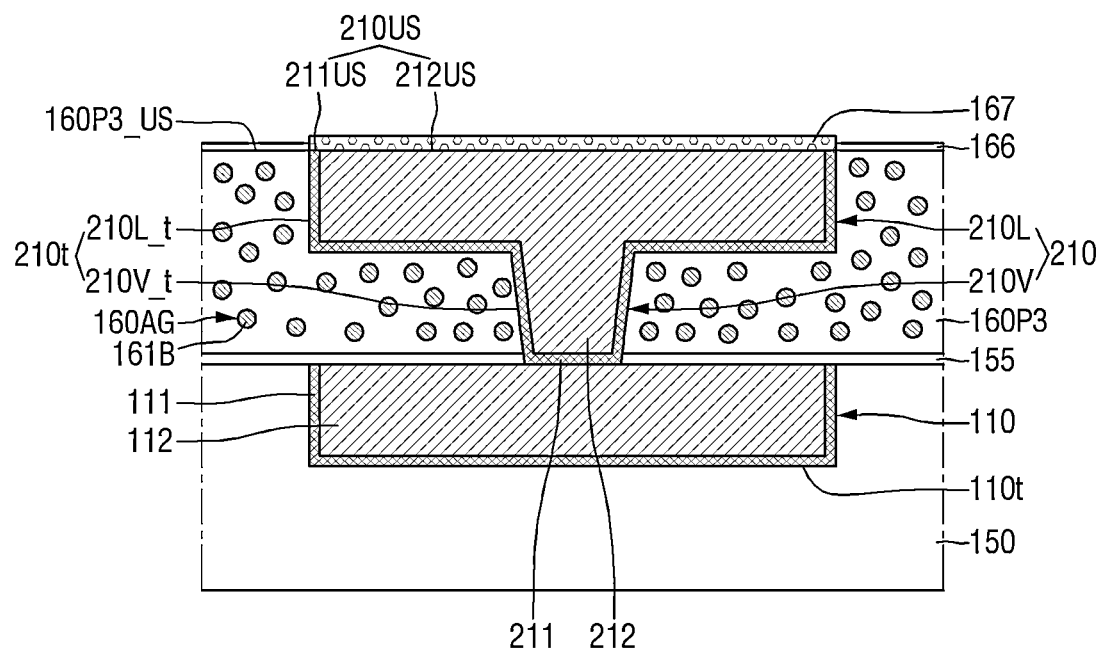

Referring to FIG. 23, the inserted insulating film 166 is formed along a upper surface 160P3_US of the modified interlayer insulating film.

In a state in which the deposition inhibition film 167 has been formed, the inserted insulating film 166 is formed on the modified interlayer insulating film 160P3. In an area where the deposition inhibition film 167 is formed, the inserted insulating film 166 is not formed. The inserted insulating film 166 does not extend along and on the upper surface 212US of the second filling conductive film 212. The inserted insulating film 166 may not extend along and on the upper surface 211US of the second barrier conductive film 211.

When the inserted insulating film 166 is deposited at a high temperature, the pore filler 161B filling the pores 160AG may be vaporized and removed. That is, the inserted insulating film 166 may be formed at a temperature at which the pore filler 161B is vaporized and thus is not removed.

Figure 24:
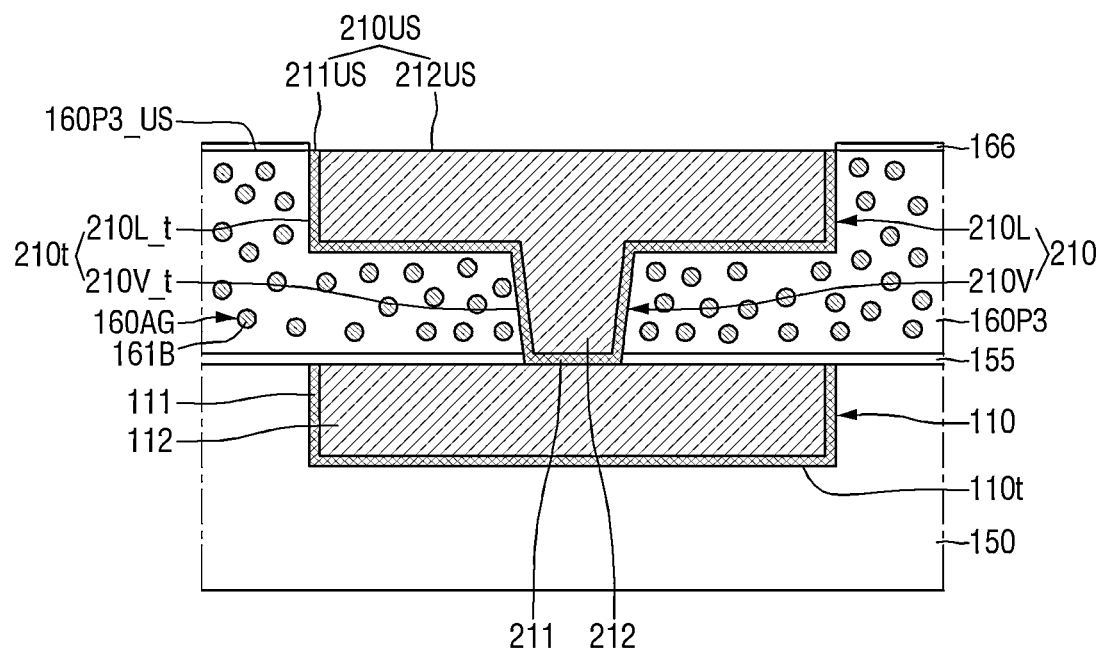

Referring to FIG. 23 and FIG. 24, the deposition inhibition film 167 formed on the upper surface 210US of the second line structure is removed.

Accordingly, the upper surface 210US of the second line structure may be exposed.

Figure 25:
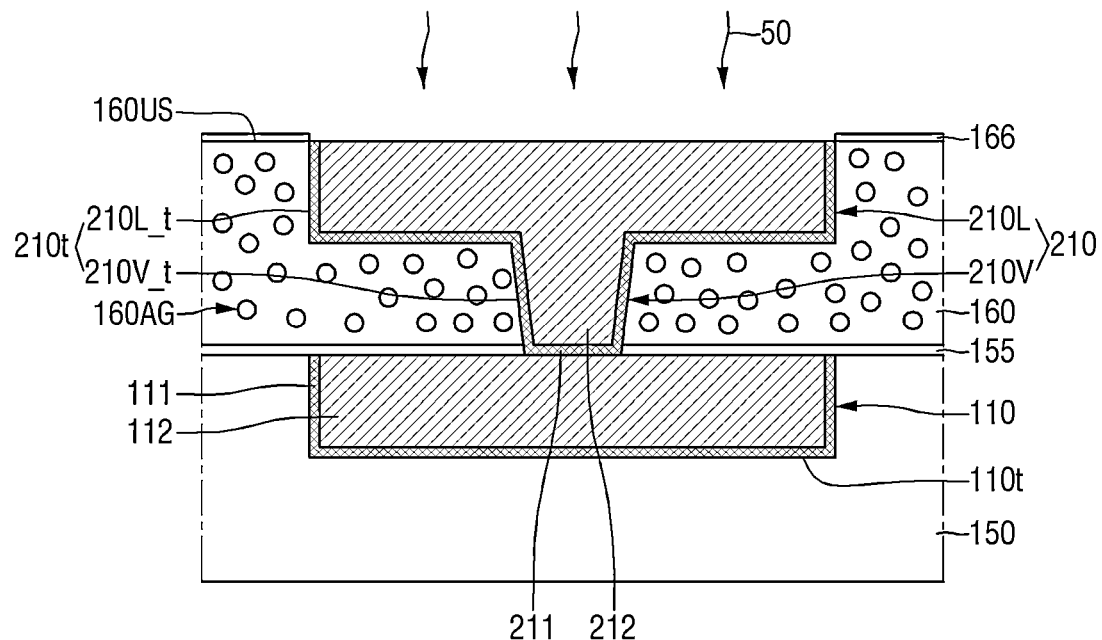

Referring to FIG. 24 and FIG. 25, the pore filler 161B filling the pores 160AG may be removed such that the second interlayer insulating film 160 containing the plurality of pores 160AG therein may be formed.

A pore filler removal process 50 may be performed such that the pore filler 161B may be removed. For example, the pore filler removal process 50 may include a plasma treatment process. Ammonia gas ($NH_3$) may be used in the plasma treatment process. However, the present disclosure is not limited thereto. Further, the pore filler removal process 50 may include a heat-treating process. During the heat-treating process, pressurization or depressurization may be performed simultaneously with the heat-treating process/

When a metal oxide is formed on the upper surface 210US of the second line structure, the metal oxide may be reduced during the plasma treatment process.

In FIG. 18 and FIG. 19, the pre-interlayer insulating film 160P2 is formed by densification of the pore insulating mold film 160P1. Therefore, while the pore filler 161B is removed, the modified interlayer insulating film 160P3 may not substantially shrink.

Figure 26:
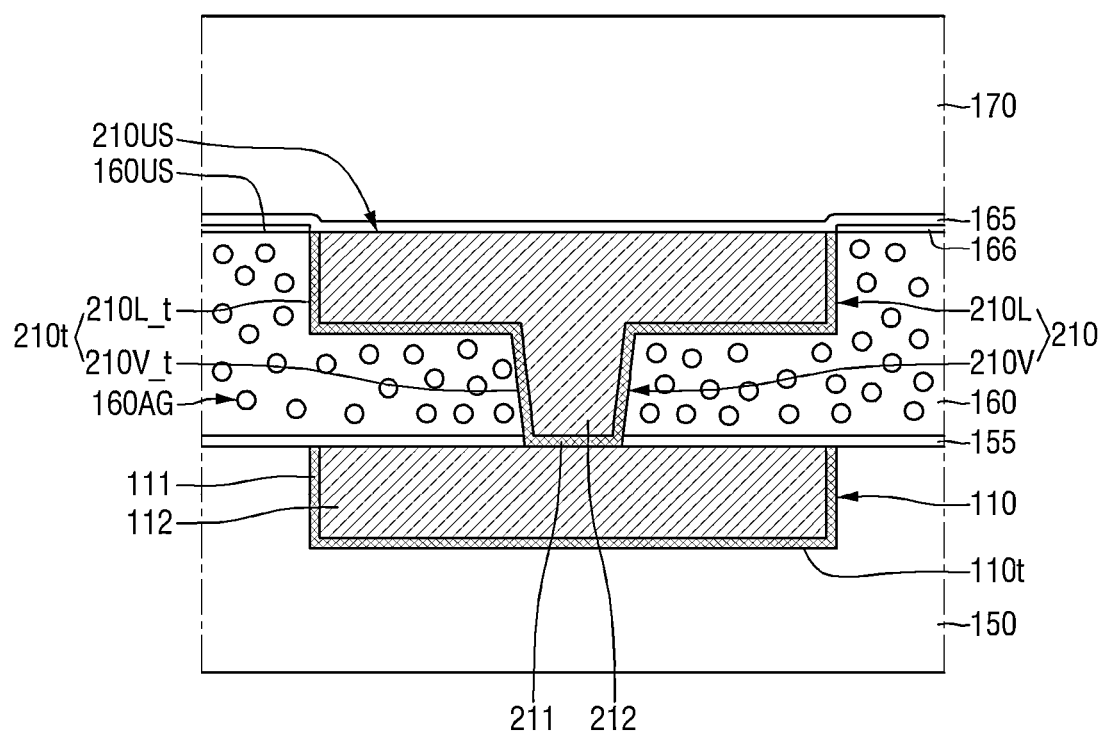

Referring to FIG. 26, the second barrier insulating film 165 is formed along and on the upper surface of the inserted insulating film 166 and the upper surface 210US of the second line structure 210.

The third interlayer insulating film 170 is formed on the second barrier insulating film 165.

Referring to FIG. 1, the third line structure 310 is formed on the second barrier insulating film 165. The third line structure 310 is formed in the third interlayer insulating film 170.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:
1. A semiconductor device comprising:
  a first interlayer insulating film containing therein a plurality of pores;
  a first line structure in the first interlayer insulating film;
  an inserted insulating film extending along an upper surface of the first interlayer insulating film and in contact with the first interlayer insulating film;
  a barrier insulating film in contact with the inserted insulating film and extending along an upper surface of the inserted insulating film and an upper surface of the first line structure;
  a second interlayer insulating film on the barrier insulating film; and
  a second line structure in the second interlayer insulating film and connected to the first line structure,
  wherein each pore of at least some of the plurality of pores contains nitrogen-containing residue.
2. The semiconductor device of claim 1, wherein
  the first line structure includes a barrier conductive film and a filling conductive film on the barrier conductive film, and p1 the inserted insulating film does not extend along an upper surface of the filling conductive film.
3. The semiconductor device of claim 1, wherein the inserted insulating film includes at least one of silicon oxide, silicon oxycarbide, and silicon oxycarbonitride.
4. The semiconductor device of claim 3, wherein the inserted insulating film includes a metal.
5. The semiconductor device of claim 4, wherein the metal included in the inserted insulating film is aluminum (Al).

6. The semiconductor device of claim 1, wherein
the first line structure includes a barrier conductive film and a filling conductive film on the barrier conductive film, and
the barrier insulating film is in contact with an upper surface of the filling conductive film.

7. The semiconductor device of claim 1, wherein the first line structure includes a barrier conductive film, a filling conductive film on the barrier conductive film, and a capping conductive film extending along an upper surface of the filling conductive film.

8. The semiconductor device of claim 1, wherein
the plurality of pores includes a first pore that has the nitrogen-containing residue therein and a second pore that does not have the nitrogen-containing residue therein, and
the second pore is closer to the inserted insulating film than the first pore.

9. The semiconductor device of claim 1, wherein
the plurality of pores includes a first pore and a second pore, wherein a nitrogen concentration in the second pore is lower than a nitrogen concentration in the first pore, and
wherein the second pore is closer to the inserted insulating film than the first pore.

10. The semiconductor device of claim 1, wherein
the barrier insulating film includes at least one of silicon nitride or silicon carbonitride, and
the barrier insulating film is in contact with the second interlayer insulating film.

11. A semiconductor device comprising:
a first interlayer insulating film containing therein a plurality of pores;
a first line structure in the first interlayer insulating film, the first line structure including a wire line and a via connected to the wire line;
an inserted insulating film on the first interlayer insulating film and including a silicon oxide-based material; and
a barrier insulating film on the inserted insulating film and including a silicon nitride-based material, the barrier insulating film covering an upper surface of the wire line;
a second interlayer insulating film on the barrier insulating film; and
a second line structure in the second interlayer insulating film and connected to the first line structure,
wherein the first interlayer insulating film includes,
a first damaged area extending along an upper surface of the first interlayer insulating film; and
a second damaged area extending along a sidewall of the wire line, and wherein a thickness of the second damaged area is greater than a thickness of the first damaged area.

12. The semiconductor device of claim 11, wherein
the first line structure includes a barrier conductive film and a filling conductive film on the barrier conductive film, and
the inserted insulating film does not extend along an upper surface of the filling conductive film.

13. The semiconductor device of claim 11, wherein the inserted insulating film includes aluminum (Al).

14. The semiconductor device of claim 11, wherein
the first line structure includes a barrier conductive film and a filling conductive film on the barrier conductive film,
wherein the barrier insulating film is in contact with an upper surface of the filling conductive film.

15. The semiconductor device of claim 11, wherein each of at least some of the plurality of pores contains nitrogen-containing residue.

16. The semiconductor device of claim 11, wherein the inserted insulating film is in contact with the first interlayer insulating film and the barrier insulating film.

17. A semiconductor device comprising:
a first interlayer insulating film;
a first line structure in the first interlayer insulating film;
a second interlayer insulating film on the first interlayer insulating film and the first line structure, the second interlayer insulating film including a plurality of pores therein, wherein each pore of at least some of the plurality of pores contains nitrogen-containing residue;
a second line structure in the second interlayer insulating film, the second line structure including a barrier conductive film and a filling conductive film on the barrier conductive film;
an inserted insulating film extending along an upper surface of the second interlayer insulating film and not extending along an upper surface of the filling conductive film;
a barrier insulating film in contact with the inserted insulating film and extending along an upper surface of the inserted insulating film and an upper surface of the second line structure;
a third interlayer insulating film on the barrier insulating film; and
a third line structure in the third interlayer insulating film,
wherein each of the first interlayer insulating film and the third interlayer insulating film is free of a pore.

18. The semiconductor device of claim 17, wherein
the second line structure includes a wire line and a via connected to the wire line, the second interlayer insulating film includes,
a first damaged area extending along the upper surface of the second interlayer insulating film; and
a second damaged area extending along a sidewall of the wire line, and
a thickness of the second damaged area is greater than a thickness of the first damaged area.

19. The semiconductor device of claim 17, wherein
the inserted insulating film includes at least one of silicon oxide, silicon oxycarbide, or silicon oxycarbonitride, and
the inserted insulating film further contains aluminum.

* * * * *